(12) United States Patent
Chen et al.

(10) Patent No.: US 11,480,823 B2
(45) Date of Patent: Oct. 25, 2022

(54) ARRAY SUBSTRATE, TOUCH DISPLAY PANEL, AND TOUCH DISPLAY APPARATUS

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Junsheng Chen, Beijing (CN); Hui Wang, Beijing (CN); Xianjie Shao, Beijing (CN)

(73) Assignees: HEFEI BOE OPTOELECTRONICS TECHNOLOGY CO., LTD., Anhui (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 16/975,445

(22) PCT Filed: Dec. 13, 2019

(86) PCT No.: PCT/CN2019/125367
§ 371 (c)(1),
(2) Date: Aug. 25, 2020

(87) PCT Pub. No.: WO2020/135113
PCT Pub. Date: Jul. 2, 2020

(65) Prior Publication Data
US 2021/0018781 A1 Jan. 21, 2021

(30) Foreign Application Priority Data
Dec. 26, 2018 (CN) .......................... 201811603488.1

(51) Int. Cl.
*G02F 1/1333* (2006.01)
*G02F 1/1362* (2006.01)
(Continued)

(52) U.S. Cl.
CPC .... *G02F 1/13338* (2013.01); *G02F 1/134309* (2013.01); *G02F 1/136286* (2013.01);
(Continued)

(58) Field of Classification Search
CPC ........... G02F 1/13338; G02F 1/134309; G02F 1/136286; G02F 1/134318;
(Continued)

(56) References Cited

U.S. PATENT DOCUMENTS 9,229,287 B2 * 1/2016 Choi ................. G02F 1/136227
9,530,341 B2 * 12/2016 Cheng ..................... H01L 27/12
(Continued)

FOREIGN PATENT DOCUMENTS

CN 102841716 A 12/2012
CN 105892175 A 8/2016
(Continued)

*Primary Examiner* — Ricardo Osorio
(74) *Attorney, Agent, or Firm* — McDermott Will & Emery LLP

(57) ABSTRACT

An array substrate has a plurality of sub-pixel regions, and each sub-pixel region includes an opening region and a pixel defining region surrounding the opening region. The array substrate includes a base and a plurality of touch signal lines disposed on the base. An orthographic projection of at least one touch signal line on the base passes through, along an extending direction thereof, at least one opening region.

15 Claims, 21 Drawing Sheets

(51) Int. Cl.
*G06F 3/041* (2006.01)
*G06F 3/044* (2006.01)
*H01L 27/12* (2006.01)
*G02F 1/1343* (2006.01)

(52) U.S. Cl.
CPC .......... *G06F 3/0412* (2013.01); *G06F 3/0443* (2019.05); *G06F 3/04164* (2019.05); *H01L 27/124* (2013.01); *G02F 1/134318* (2021.01); *G02F 2201/123* (2013.01); *G06F 2203/04103* (2013.01)

(58) Field of Classification Search
CPC ..... G02F 2201/123; G02F 2203/04103; G06F 3/04164; G06F 3/0443; G06F 3/0412; H01L 27/124
See application file for complete search history.

(56) References Cited

U.S. PATENT DOCUMENTS

| | | | | |
|---|---|---|---|---|
| 10,969,885 | B2* | 4/2021 | Liu | G02F 1/13338 |
| 2014/0055685 | A1 | 2/2014 | Wang et al. | |
| 2016/0062527 | A1* | 3/2016 | Lee | G06F 3/04164 345/173 |
| 2016/0328070 | A1* | 11/2016 | Lin | G06F 3/04164 |
| 2016/0357048 | A1* | 12/2016 | Zhou | H01L 27/124 |
| 2017/0017327 | A1* | 1/2017 | Chang | G06F 3/0412 |
| 2017/0160852 | A1* | 6/2017 | Ahn | G06F 3/0416 |
| 2017/0307933 | A1* | 10/2017 | Chen | G06F 3/041 |
| 2018/0039358 | A1* | 2/2018 | Xie | G06F 3/0443 |
| 2018/0299985 | A1* | 10/2018 | Wang | G06F 3/0443 |
| 2018/0341353 | A1* | 11/2018 | Zhang | G02F 1/13338 |
| 2018/0341356 | A1* | 11/2018 | Wu | G06F 3/0443 |
| 2019/0018271 | A1* | 1/2019 | Xie | G02F 1/13439 |
| 2019/0042047 | A1* | 2/2019 | Liao | G06F 3/04164 |
| 2019/0056830 | A1* | 2/2019 | Li | G02F 1/13458 |
| 2019/0064568 | A1* | 2/2019 | Zheng | H01L 21/02675 |
| 2019/0064987 | A1* | 2/2019 | Lu | G02F 1/13338 |
| 2019/0146254 | A1* | 5/2019 | Huang | G06F 3/0412 349/12 |
| 2019/0179207 | A1* | 6/2019 | Lin | G02F 1/1368 |
| 2019/0235294 | A1* | 8/2019 | Wang | G02F 1/13338 |
| 2019/0235675 | A1* | 8/2019 | Wu | G06F 3/0448 |
| 2021/0064175 | A1* | 3/2021 | Fu | G06F 3/0412 |

FOREIGN PATENT DOCUMENTS

| | | | |
|---|---|---|---|
| CN | 107728367 | A | 2/2018 |
| CN | 108445663 | * | 8/2018 |
| CN | 108445663 | A | 8/2018 |
| CN | 109582179 | A | 4/2019 |
| KR | 101862048 | B1 | 5/2018 |

* cited by examiner

ARRAY SUBSTRATE, TOUCH DISPLAY PANEL, AND TOUCH DISPLAY APPARATUS

CROSS-REFERENCE TO RELATED APPLICATIONS

This application is a national phase entry under 35 USC 371 of International Patent Application No. PCT/CN2019/125367 filed on Dec. 13, 2019, which claims priority to Chinese Patent Application No. 201811603488.1, filed on Dec. 26, 2018, which are incorporated herein by reference in their entirety.

TECHNICAL FIELD

The present disclosure relates to the field of touch display technologies, and in particular, to an array substrate, a touch display panel and a touch display apparatus.

BACKGROUND

In recent years, with the development of display technologies, display apparatuses are becoming thinner and thinner. For a touch display apparatus, how a touch function is realized directly affects an overall thickness of the display apparatus.

SUMMARY

In one aspect, an array substrate is provided. The array substrate has a plurality of sub-pixel regions, and each sub-pixel region includes an opening region and a pixel defining region surrounding the opening region. The array substrate includes a base and a plurality of touch signal lines disposed on the base. An orthographic projection of at least one touch signal line on the base passes through, along an extending direction thereof, at least one opening region.

In some embodiments, the array substrate further includes a plurality of touch electrodes disposed above the base. Each touch electrode is connected to at least one touch signal line.

In some embodiments, the array substrate further includes a plurality of pixel electrodes disposed above the base, and each pixel electrode is located in an opening region. The plurality of pixel electrodes are located on a side of the plurality of touch electrodes facing the base, and the plurality of touch signal lines are located on a side of the plurality of pixel electrodes facing away from the plurality of touch electrodes.

In some embodiments, the array substrate further includes a common electrode disposed above the base. The common electrode includes a plurality of sub-common electrodes that are insulated from each other. Each sub-common electrode is connected to at least one touch signal line.

In some embodiments, the array substrate further includes a plurality of pixel electrodes disposed above the base. Each pixel electrode is located in an opening region. The plurality of pixel electrodes are located on a side of the common electrode facing the base, and the plurality of touch signal lines are located on a side of the plurality of pixel electrodes facing away from the common electrode.

In some embodiments, in the at least one touch signal line, each touch signal line includes a first portion and a second portion that are connected to each other. An orthographic projection of the first portion on the base is located within an orthographic projection of at least one pixel electrode on the base, and an orthographic projection of the second portion on the base is located within at least one pixel defining region.

In some embodiments, each sub-common electrode includes at least one second through hole; and the orthographic projection of the first portion on the base further partially overlaps with an orthographic projection of at least one second through hole on the base.

In some embodiments, each sub-common electrode includes at least one second through hole, and in the at least one touch signal line, each touch signal line includes a first portion and a second portion that are connected to each other. An orthographic projection of the first portion on the base is located within an orthographic projection of at least one pixel electrode on the base, and is further located within an orthographic projection of at least one second through hole on the base. An orthographic projection of the second portion on the base is located within at least one pixel defining region.

In some embodiments, each pixel electrode includes at least one first through hole. The orthographic projection of the first portion on the base is further located within an orthographic projection of at least one first through hole on the base.

In some embodiments, each sub-common electrode includes at least one second through hole; and each pixel electrode includes at least one first through hole. In the at least one touch signal line, each touch signal line includes a first portion and a second portion that are connected to each other. An orthographic projection of the second portion on the base is located within at least one pixel defining region. An orthographic projection of the first portion on the base partially overlaps with an orthographic projection of at least one second through hole on the base, and is located within an orthographic projection of at least one first through hole on the base.

In some embodiments, the orthographic projection of the at least one first through hole on the base is strip-shaped; or, the orthographic projection of the at least one second through hole on the base is strip-shaped; or, the orthographic projection of the at least one first through hole and the orthographic projection of the at least one second through hole on the base are strip-shaped.

In some embodiments, in the at least one first through hole, a width of each first through hole in a first direction is less than a width of a second through hole directly opposite thereto in the first direction. The first direction is perpendicular to the extending direction of the at least one touch signal line.

In some embodiments, the array substrate further includes a plurality of data lines disposed on the base. The extending direction of the at least one touch signal line is parallel with extending directions of the plurality of data lines. In the at least one touch signal line, each touch signal line is located between two adjacent data lines, and distances between each touch signal line and two data lines adjacent thereto are equal.

In some embodiments, the array substrate further includes a plurality of gate lines and a plurality of data lines that are disposed above the base. Extending directions of the plurality of gate lines are parallel with a first direction, and extending directions of the plurality of data lines are parallel with a second direction. The first direction and the second direction intersect. The plurality of data lines and the plurality of gate lines define the plurality of sub-pixel regions; and extending directions of the plurality of touch signal lines are parallel with the second direction.

In some embodiments, the plurality of touch signal lines and the plurality of data lines are arranged in a same layer.

In some embodiments, a number of the plurality of touch signal lines is same as a number of sub-pixel regions arranged in a same line in the first direction.

In some embodiments, a width of each touch signal line is within a range from 1.5 µm to 4 µm, inclusive.

In some embodiments, among the plurality of touch signal lines, a distance between every two adjacent touch signal lines is equal.

In another aspect, a touch display panel is provided. The display panel includes the array substrate described in any one of the above embodiments.

In yet another aspect, a touch display apparatus is provided. The touch display apparatus includes a controller and the touch display panel described in any one of the above embodiments. The plurality of touch signal lines are all electrically connected to the controller, and the controller is configured to implement touch control according to signal changes on the plurality of touch signal lines.

BRIEF DESCRIPTION OF THE DRAWINGS

In order to describe technical solutions in the present disclosure more clearly, accompanying drawings to be used in some embodiments of the present disclosure will be introduced briefly. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on an actual size of a product, an actual process of a method, or an actual timing of signals involved the embodiments of the present disclosure.

DETAILED DESCRIPTION

Figures 1, 2:
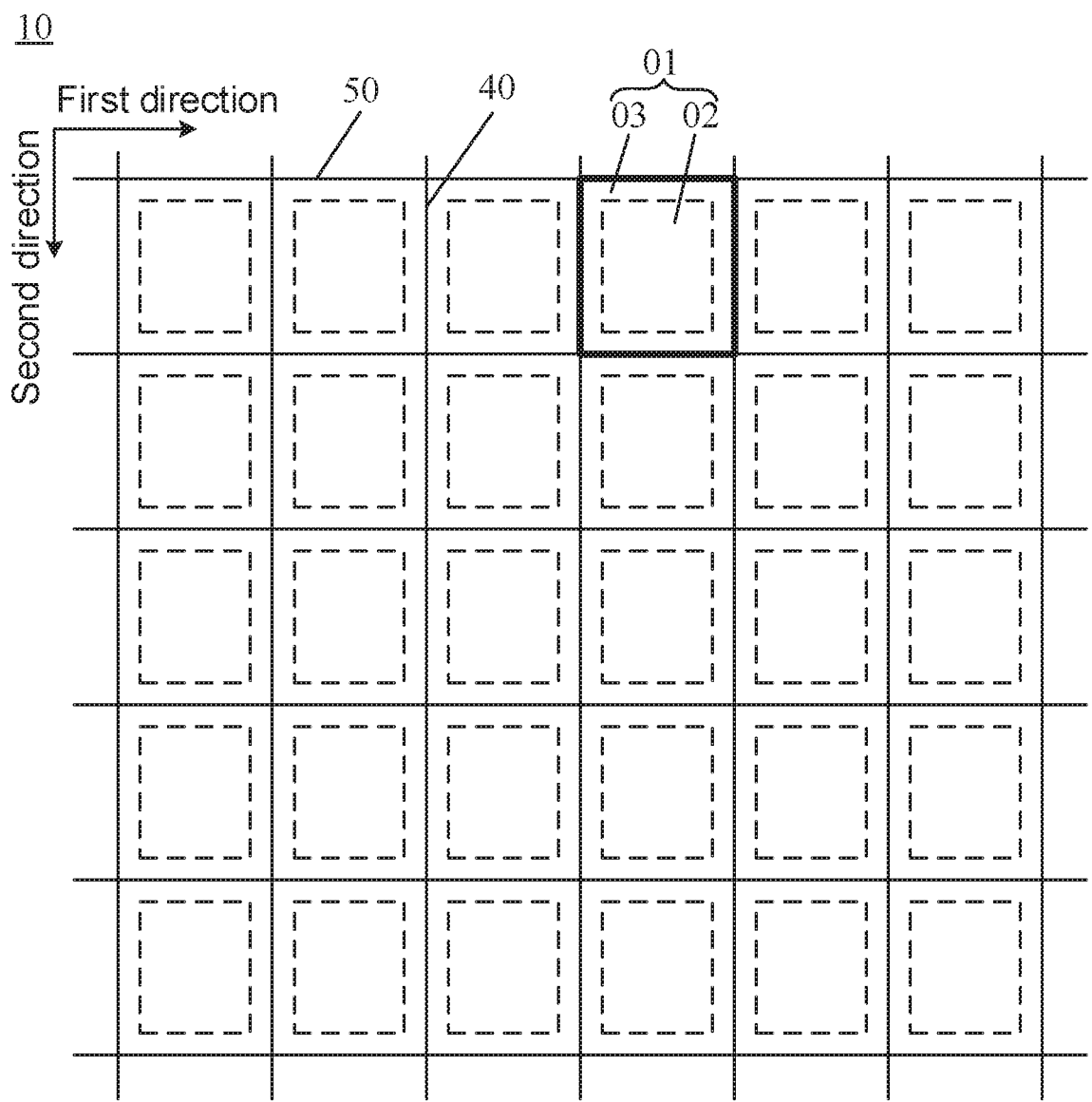
FIG. 1 is a structural diagram of a liquid crystal touch display apparatus.
FIG. 2 is a structural diagram of an array substrate according to some embodiments.

The technical solutions in embodiments of the present disclosure will be described clearly and completely in combination with the accompanying drawings in the embodiments of the present disclosure. Obviously, the described embodiments are merely some but not all of the embodiments of the present disclosure. All other embodiments obtained based on the embodiments of the present disclosure by a person of ordinary skill in the art without paying any creative effort shall be included in the protection scope of the present disclosure.

In the Description and the claims, each term may have nuanced meanings implied in the context in addition to its clearly stated meanings. Similarly, phrase "in one embodiment" or "in some embodiments" does not necessarily refer to same embodiment(s), and phrase "in another embodiment" or "in some other embodiments" does not necessarily refer to different embodiment(s). Similarly, phrase "in one example" or "in some examples" does not necessarily refer to same example(s), and phrase "in another example" or "in some other examples" does not necessarily refer to different example(s). For example, the claimed subject matter is intended to include, in whole or in part, exemplary embodiments or combinations of examples.

In general, terms can be understood at least in part from their use in context. For example, terms such as "and", "or", and "and/or" as used herein may include various meanings, which may depend at least in part on the context in which these terms are used. In general, if "or" is used to connect several objects, such as "A, B, or C", it is intended to mean A, B, and C (meaning inclusive here), and A, B, or C (meaning each alone here). If "and/or" is used to connect several objects, such as "A and/or B", it will be understood as: only A, only B, or A and B. That is, "A and/or B" includes three meanings. In addition, the term "one or more" or "at least one" used herein, at least in part depending on the context, may be used to describe any feature, structure, or characteristic in a singular sense, or may be used to describe a combination of features, structures, or characteristic in a plural sense. In general, if "at least one" is used to connect several objects, such as "at least one of A and B", it will be understood as "only A, only B, or both A and B". Similarly, based at least in part on the context, terms such as "one" or "the" will be understood in the singular sense or in the plural sense. In addition, based at least in part on the context, the term "based on" or "determined by" may be understood as not necessarily intended to refer to a set of exclusive elements, but may allow the presence of other elements that are not necessarily explicitly described.

Terms "first", "second" and the like used in the embodiments of the present disclosure are not intended to indicate any order, quantity or importance, and are merely used to distinguish different components. "Include", "comprise" or other similar words mean that an element or an item preceding the word covers element(s) or item(s) listed after the word and their equivalents, but do not exclude other elements or items. "Connected", "coupled" or other similar words are not limited to physical or mechanical connections, but may include electrical connections, whether direct or indirect. "Upper", "lower", "left", "right", etc. are only used to indicate a relative positional relationship, and when an absolute position of a described object changes, the relative positional relationship may also change accordingly.

According to a position of touch signal lines, touch display apparatuses may be divided into two categories: On Cell Touch display apparatuses and In Cell Touch display apparatuses. Referring to FIG. 1, a liquid crystal touch display apparatus is taken as an example. FIG. 1 only schematically illustrates an array substrate 10, a touch structure 30 and a color film substrate 20, and does not illustrate a liquid crystal layer. The touch structure 30 includes touch electrodes and touch signal lines. In an In Cell Touch method, the touch structure 30 is disposed inside a display panel and does not occupy any space outside the display panel. In this way, a thickness of a display apparatus including such the display panel may be reduced. The In Cell Touch method has becomes a mainstream touch method at present.

Embodiments of the present disclosure provide an array substrate 10. As shown in FIG. 2, the array substrate 10 includes a base, a plurality of sub-pixels 01, and a plurality of gate lines 50 extending in a first direction and a plurality of data lines 40 extending in a second direction that are disposed on the base. The first direction and the second direction intersect. The plurality of data lines 40 and the plurality of gate lines 50 define the plurality of sub-pixels 01, and each sub-pixel 01 includes an opening region 02 and a pixel defining region 03 surrounding the opening region 02. In FIG. 2, a region enclosed by a thick solid line is the sub-pixel 01, a region enclosed by a dotted line is the opening region 02, and a region of the sub-pixel 01 other than the opening region 02 is the pixel defining region 03.

Herein, the description that the first direction and the second direction intersect means that: in some embodiments, the first direction is perpendicular to the second direction; in some embodiments, an included angle between the first direction and the second direction is an acute angle; and in some embodiments, the included angle between the first direction and the second direction is an obtuse angle. The embodiments of the present disclosure do not limit this.

It will be noted that, in a case where the array substrate 10 is an array substrate in a liquid crystal display (LCD) apparatus, the opening region 02 is a light-transmitting region, and the pixel defining region 03 is a non-light-transmitting region. In a case where the array substrate 10 is an array substrate in a self-luminous display apparatus such as an organic light-emitting diode (OLED) display apparatus, a region where a light-emitting device is located is the opening region 02, and a region other than the region where the light-emitting device is located is the pixel defining region 03. The array substrate 10 is illustrated in all the drawings by taking an example in which the array substrate 10 is an array substrate in an LCD apparatus.

Figure 3:
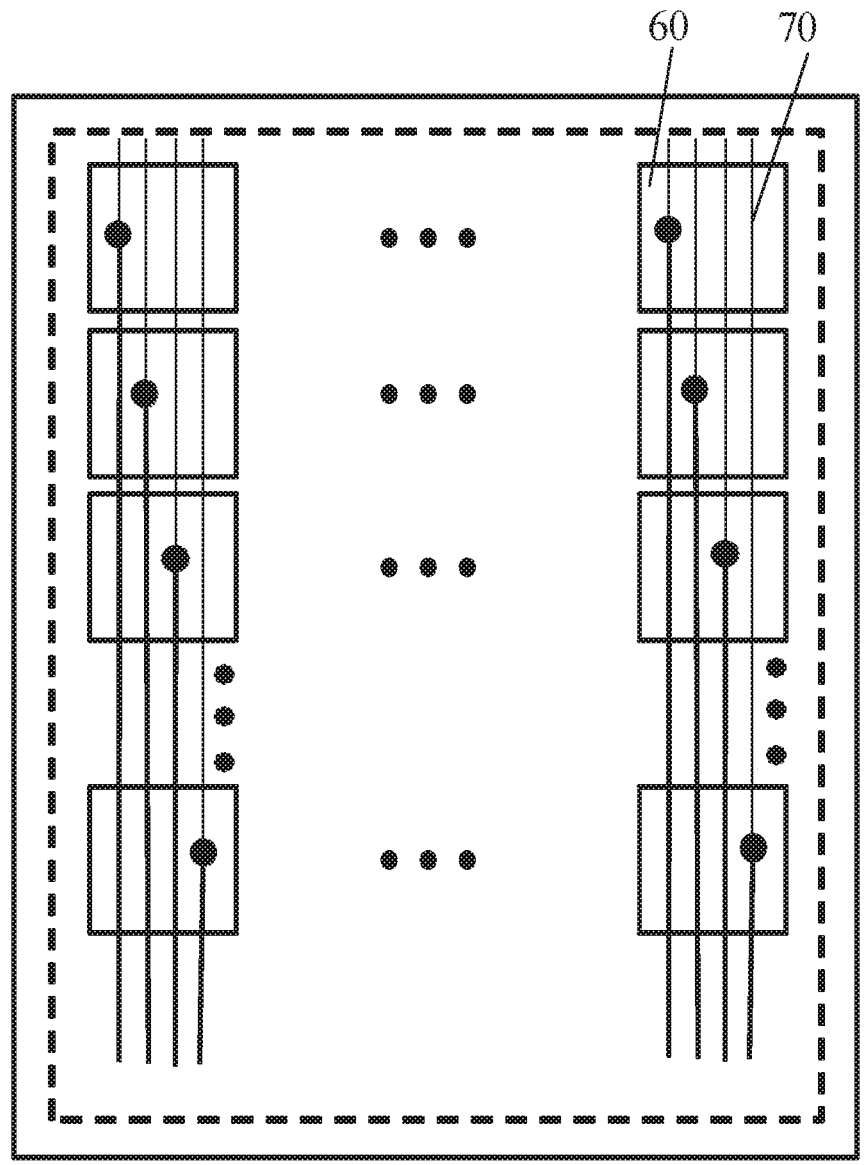
FIG. 3 is a structural diagram of a touch display apparatus.
Figure 4:
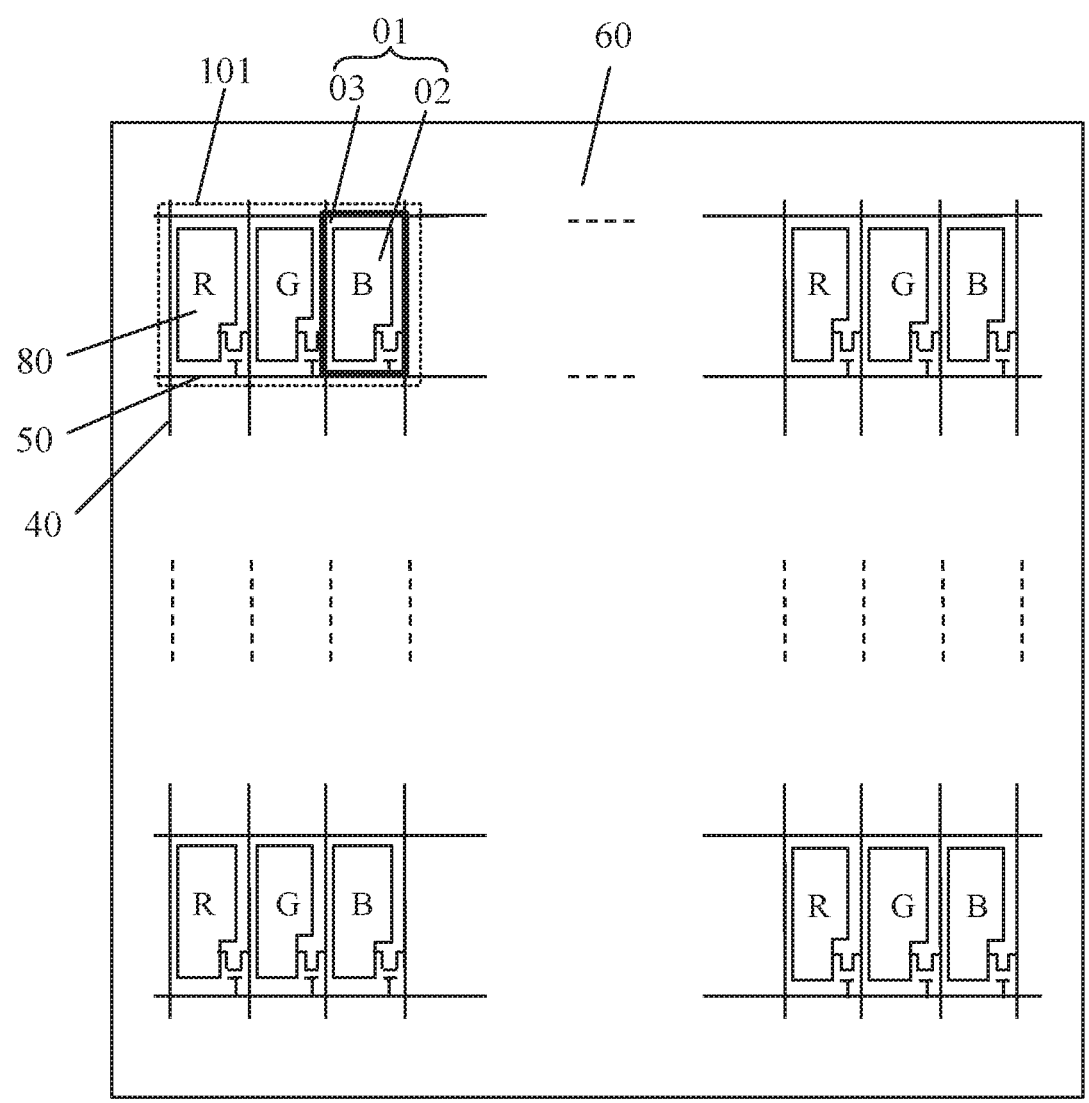
FIG. 4 is a structural diagram of a touch electrode covering a plurality of pixels.

In an In Cell Touch display apparatus, the touch structure is disposed in a display region of the array substrate 10. As shown in FIG. 3, the touch structure includes a plurality of touch electrodes 60 (also referred to as touch units) arranged in a matrix, and each touch electrode 60 is connected to a touch signal line 70. As shown in FIG. 4, each touch electrode 60 corresponds to a plurality of pixels 101 arranged in a matrix, and each pixel 101 includes a plurality of sub-pixels 01, for example, a red sub-pixel (R), a green sub-pixel (G), and a blue sub-pixel (B). In order to control a brightness of light emitted from the opening region 02 of each sub-pixel 01, it is arranged that the opening region 02 of each sub-pixel 01 includes a pixel electrode 80. That is, as shown in FIG. 4, a corresponding region where the pixel electrode 80 is located is the opening region 02, and a region of each sub-pixel 01 other than the region where the pixel electrode 80 is located is the pixel defining region 03.

Figure 5:
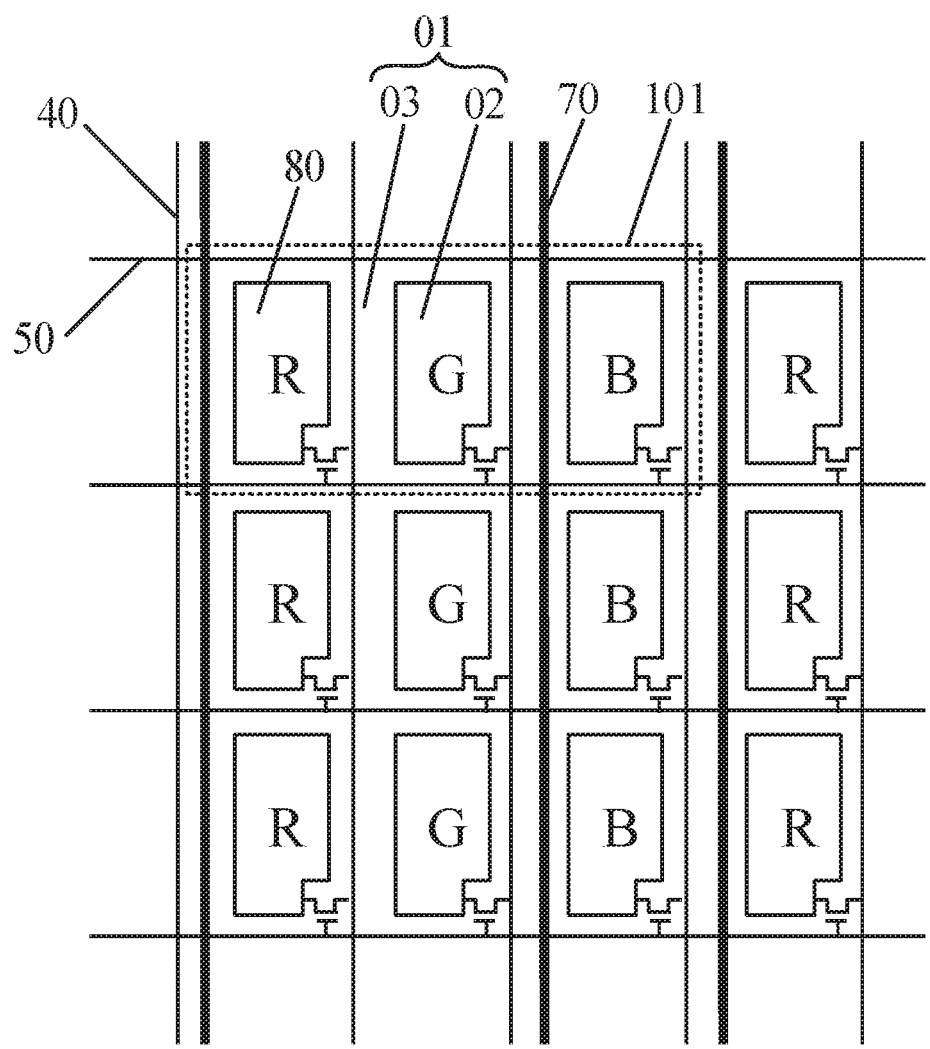
FIG. 5 is a structural diagram of an arrangement manner of touch signal lines.

In the related art, as shown in FIG. 5, the touch signal lines 70 are all arranged in pixel defining regions 03. FIG. 5 illustrates an example where each pixel 101 is provided with two touch signal lines 70 therein. In a single pixel 101, pixel defining regions of the red sub-pixel and the blue sub-pixel are each correspondingly provided with a touch signal line 70, and a pixel defining region of the green sub-pixel is not provided with a touch signal line 70.

When the data lines 40 are scanned column by column, a capacitance between the pixel electrode 80 in each sub-pixel 01 and a data line 40 will change. A change amount ΔC of the capacitance between the pixel electrode 80 in each sub-pixel 01 and the data line 40 is a difference between Cpd and Cpd' ($\Delta C = C_{pd} - C_{pd'}$). Herein, $C_{pd}$ is a capacitance between the pixel electrode 80 and a data line 40 on its left side, and $C_{pd'}$ is a capacitance between the pixel electrode 80 and a data line 40 on its right side. According to a formula $$\Delta V_p = \frac{\Delta C}{C_{gs} + C_s + C_{lc} + C_{pd} + C_{pd'}} 2V_d,$$

it can be seen that a change amount ΔVp of a voltage applied to the pixel electrode 80 is proportional to ΔC. Herein, $C_{gs}$ is a capacitance between a gate and a source of a thin film transistor, $C_s$ is a storage capacitance of the sub-pixel, $C_{lc}$ is a liquid crystal capacitance, and $V_d$ is a voltage on the data line. The larger the ΔVp, the smaller a pixel voltage applied to the pixel electrode 80. In a case where no touch signal lines 70 are provided, when the data lines 40 are scanned column by column, capacitance changes caused by signal changes on the data lines 40 on the left and right sides of the pixel electrode 80 in each sub-pixel 01 are substantially equal. That is, $C_{pd}$ is approximately equal to $C_{pd'}$ ($C_{pd} \approx C_{pd'}$). Therefore, ΔC is approximately equal to zero (ΔC≈0).

In a case where the touch signal lines 70 are arranged in the pixel defining regions 03, as shown in FIG. 5, since a touch signal line 70 is arranged on the left side of the pixel electrode 80 in each of the red sub-pixel and the blue sub-pixel, and the touch signal line 70 has a shielding effect on the data line 40 on its left side, the touch signal line 70 may affect the capacitance between the pixel electrode 80 and the data line 40 on its left side. As a result, the capacitance $C_{pd}$ between the pixel electrode 80 and the data line 40 on its left side is approximately equal to zero ($C_{pd} \approx 0$). In this way, the change amount $\Delta C$ of the capacitance depends on the capacitance $C_{pd'}$ between the pixel electrode 80 and the data line 40 on its right side. Therefore, in a case where the touch signal lines 70 are provided, the change amount $\Delta C$ of the capacitance of the red sub-pixel and the change amount $\Delta C$ of the capacitance of the blue sub-pixel are approximately equal to $C_{pd'}$ ($\Delta C \approx C_{pd'}$). According to the above formula, the change amount $\Delta V p$ of the voltage of the red sub-pixel and the change amount $\Delta V p$ of the voltage of the blue pixel are greater than the change amount $\Delta V p$ of the voltage of the green pixel. Therefore, voltages applied to the red sub-pixel and the blue sub-pixel may be relatively low. As a result, the brightness of the red sub-pixel and the blue sub-pixel may be reduced, and a display quality of a display screen may be affected. In a case where voltage deviations of the red sub-pixel, the blue sub-pixel and the green sub-pixel are different, a normal brightness ratio of red, blue and green of the display screen may be affected, resulting in color cast.

Figure 7A:
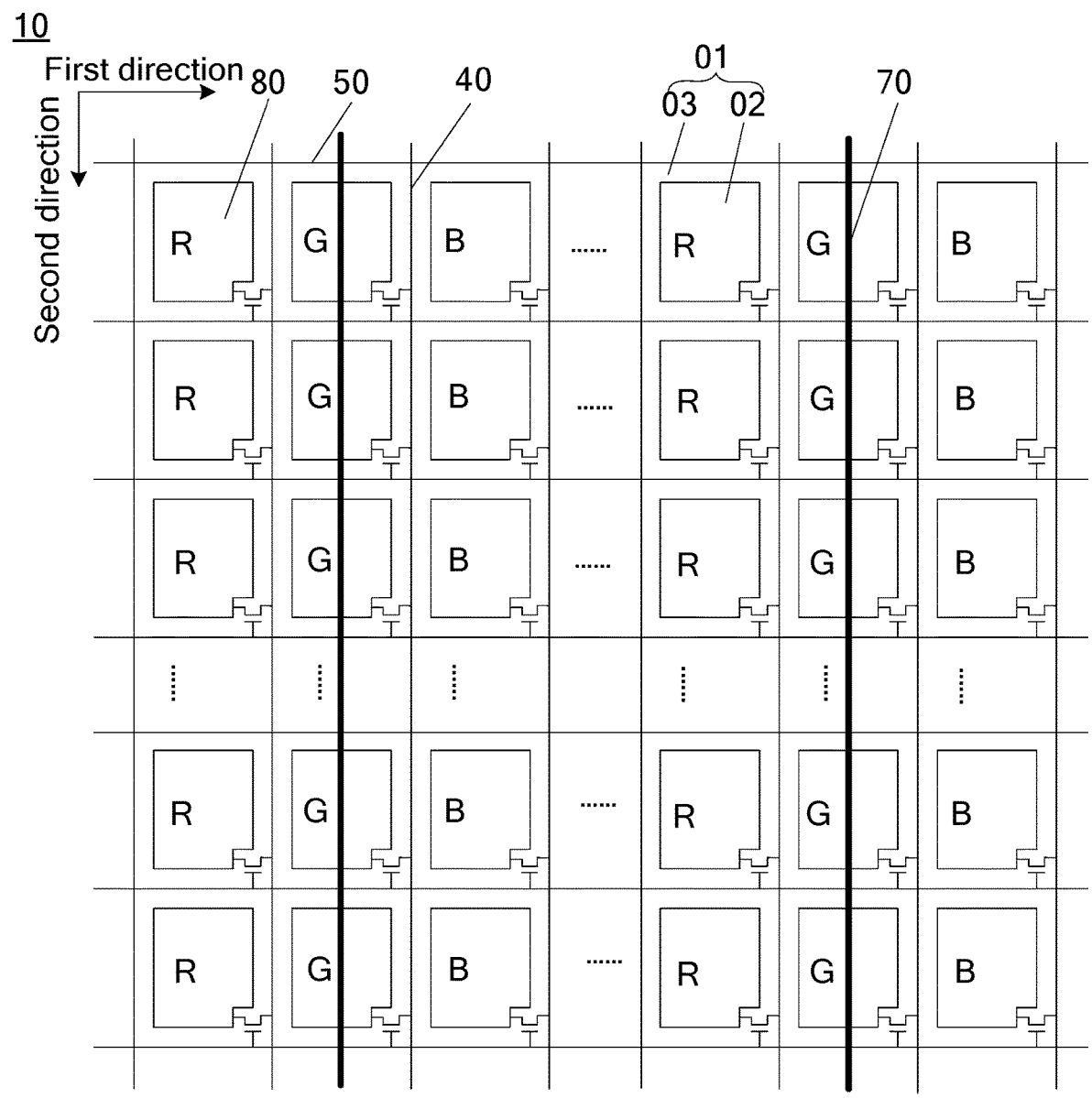
FIG. 7A is a structural diagram of another array substrate according to some embodiments.
Figure 7B:
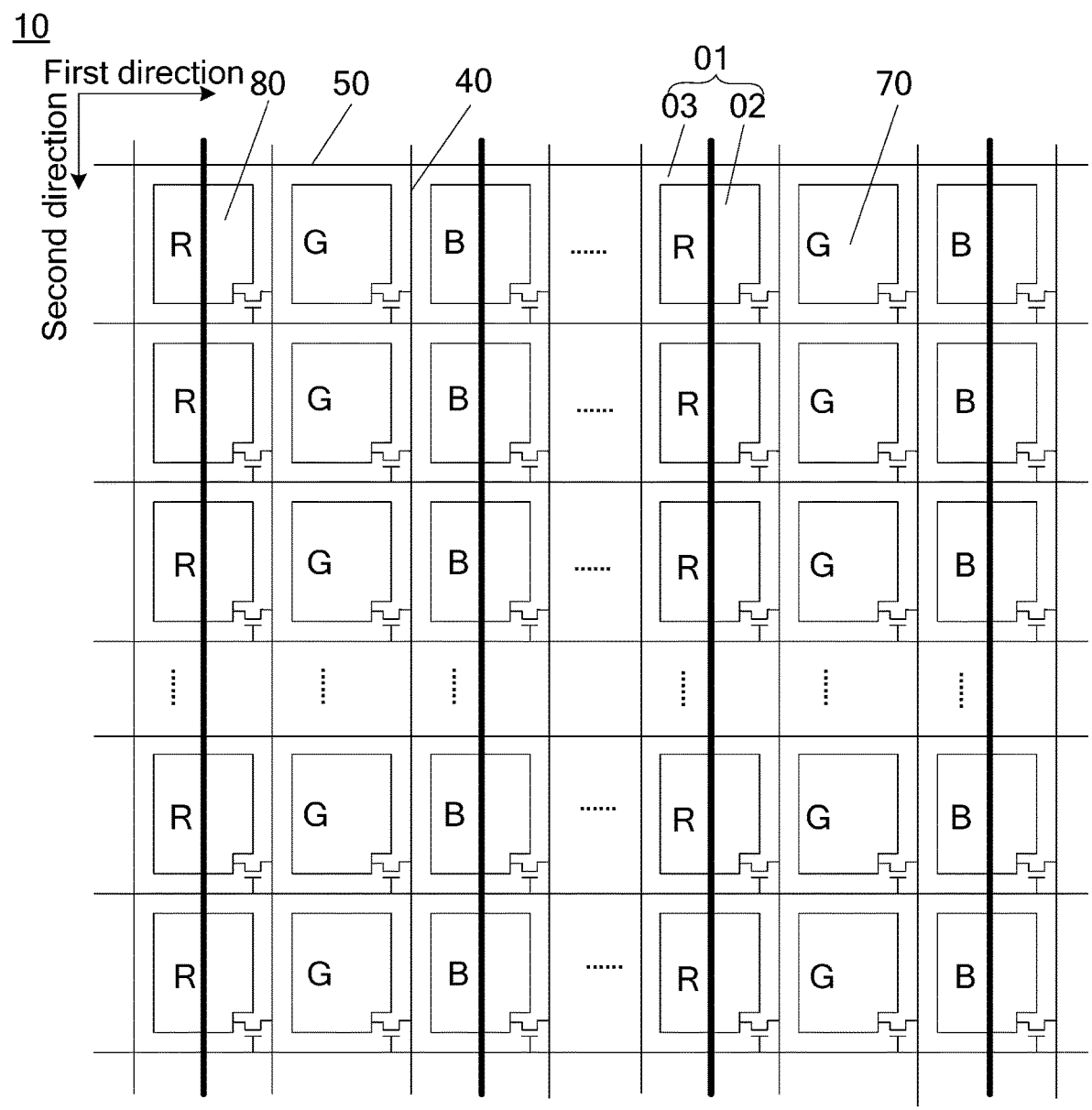
FIG. 7B is a structural diagram of yet another array substrate according to some embodiments.
Figure 7C:
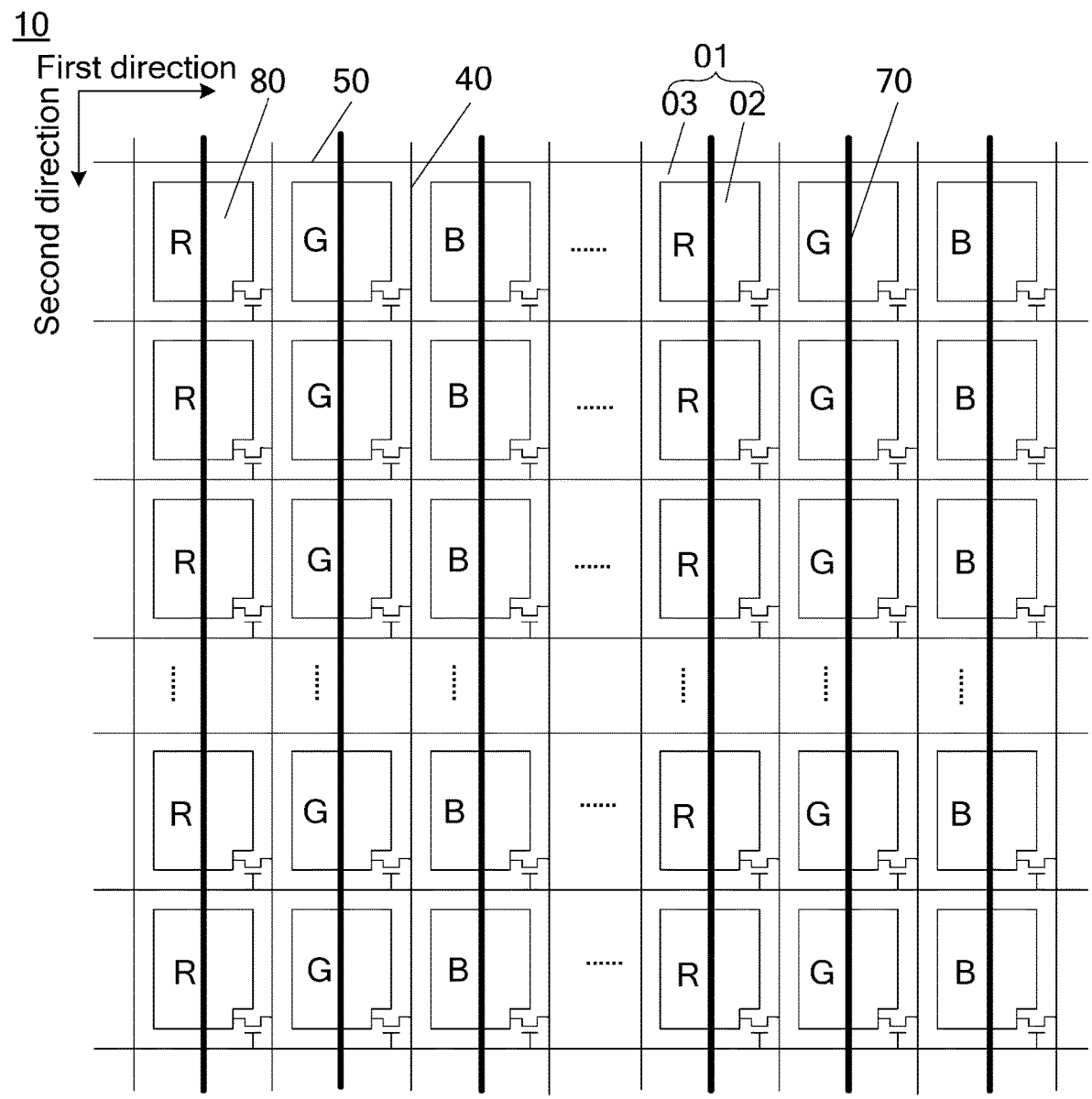
FIG. 7C is a structural diagram of yet another array substrate according to some embodiments.

Based on the above, embodiments of the present disclosure provide an array substrate. As shown in FIGS. 7A, 7B, and 7C, the array substrate 10 includes a base, a plurality of sub-pixels 01, a plurality of gate lines 50 extending in a first direction and a plurality of data lines 40 extending in a second direction that are disposed on the base, and a plurality of touch signal lines 70 extending in the second direction that are disposed on the base. The first direction and the second direction intersect. The plurality of data lines 40 and the plurality of gate lines 50 define the plurality of sub-pixels 01. Each sub-pixel 01 includes an opening region 02 and a pixel defining region 03 surrounding the opening region 02. An orthographic projection of at least one touch signal line 70 on the base passes through, along an extending direction thereof, orthographic projection(s) of corresponding one or more opening regions 02 on the base. It will be understood that, a single touch signal line 70 includes a first portion and a second portion that are connected to each other. An orthographic projection of the first portion on the base is located within orthographic projection(s) of corresponding one or more opening regions 02 on the base, and an orthographic projection of the second portion on the base is located within orthographic projection(s) of corresponding one or more pixel defining regions 03 on the base.

Herein, since the orthographic projection of the first portion of the at least one touch signal line 70 on the base is located within orthographic the projection(s) of corresponding one or more opening regions 02 on the base, in order to prevent a touch signal line 70 corresponding to the opening region(s) 02 from affecting normal display of sub-pixel(s) 01, a width of a touch signal line 70 is set to such a value that it does not affect the normal display of the sub-pixel(s) 01. In some embodiments, the width of the touch signal line 70 is within a range from 1.5 μm to 4 μm, inclusive. In some other embodiments, the width of the touch signal line 70 is within a range from 1.7 μm to 2.5 μm, inclusive.

In some embodiments, a material of the touch signal line 70 is a non-transparent conductive material, such as a metal (e.g., A, Cu, Mo, Cr, Ti, etc.). In some other embodiments, a material of the touch signal line 70 is a transparent conductive material, such as indium tin oxide (ITO) or indium zinc oxide (IZO). In this way, it may be possible to prevent the touch signal line 70 corresponding to the opening region(s) 02 from affecting the normal display of the sub-pixel(s) 01, and thus improve a light transmittance of the sub-pixel(s).

In some embodiments, the array substrate 10 further includes a plurality of touch electrodes 60, and each touch electrode 60 is connected to at least one touch signal line 70. A size of the touch electrode 60 is not limited, and may be set according to a distance between two fingers (generally 10 mm) of a person. By setting the size of the touch electrode 60 according to the distance between fingers, it may be ensured that users can perform touch operations on the screen normally when touching the display apparatus. In some embodiments, an area of the touch electrode 60 is less than 5 mm×5 mm. Furthermore, the size of the touch electrode 60 may be set according to a size and a resolution of a display region of a product.

Those skilled in the art will understand that the array substrate 10 further includes thin film transistors and other components in addition to the data lines 40, the gate lines 50, the touch signal lines 70, and the touch electrodes 60. Herein, a thin film transistor includes a source, a drain, an active layer, a gate, and a gate insulating layer. On this basis, in some embodiments, the touch signal lines 70 may be arranged in a same layer as a conductive pattern layer in the array substrate 10, or may be arranged in a different layer. In a case where the touch signal lines 70 are arranged in the same layer as the conductive pattern layer, a process of manufacturing the array substrate 10 may be simplified. For example, the touch signal lines 70 may be manufactured simultaneously with the data lines 40. In some other embodiments, the touch signal lines 70 may be manufactured separately instead of being manufactured simultaneously with other conductive pattern layers. The embodiments of the present disclosure do not limit this.

It will be understood here that in the embodiments of the present disclosure, "arranged in a same layer" means that a same film formation process is used to form a film for forming specific patterns, and then a same mask is used to form a layer structure through a single patterning process. Depending on different specific patterns, the single patterning process may include multiple exposure, development or etching processes, and the specific patterns in the formed layer structure may be continuous or discontinuous. These specific patterns may also be at different heights or have different thicknesses. For example, in the embodiments of the present disclosure, by arranging patterns of multiple elements/components in a same layer, a number of film layers that need to be manufactured may not be increased, which is conducive to reducing a thickness of a display panel and simplifying a manufacturing process thereof.

Figure 7D:
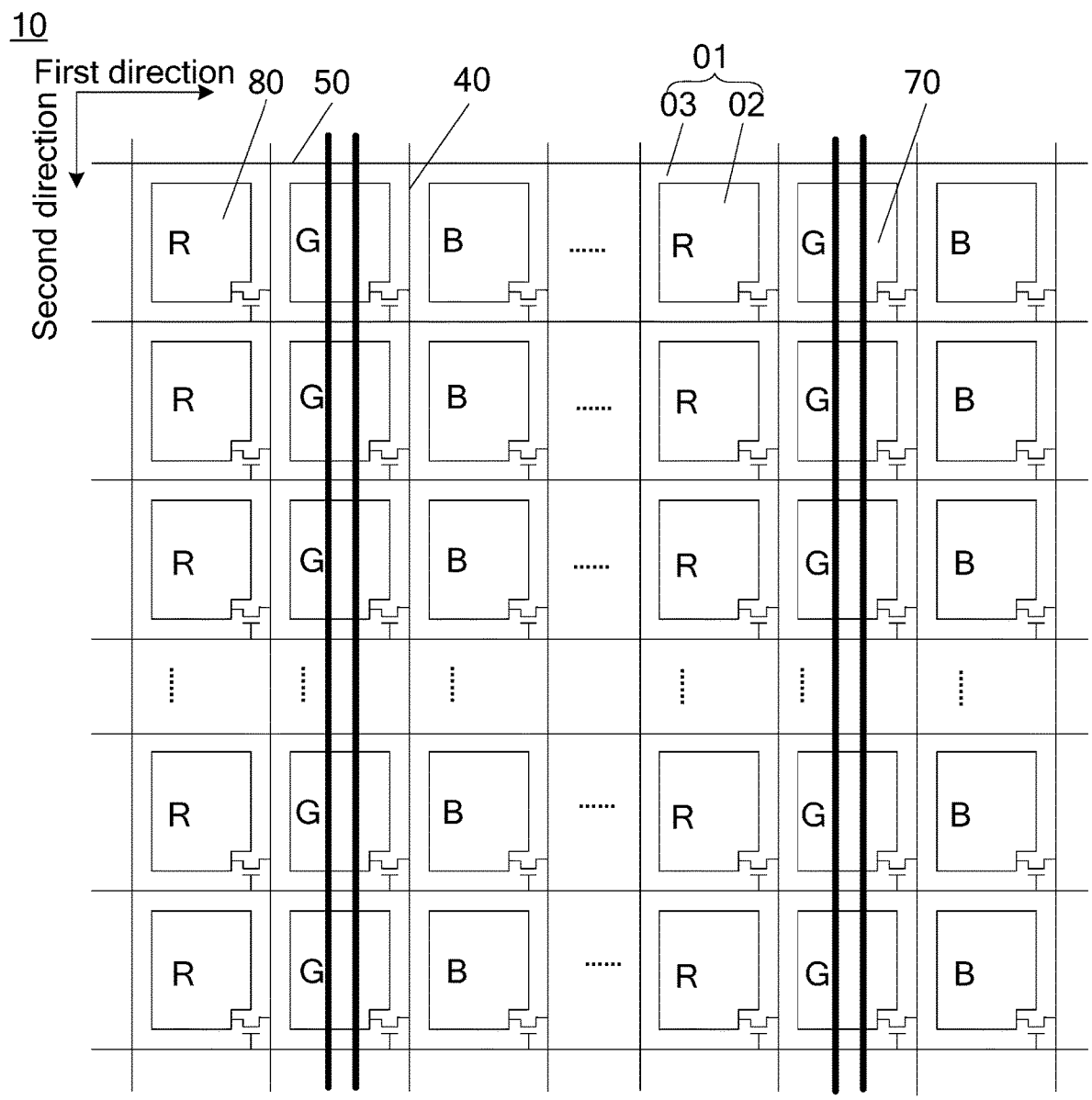
FIG. 7D is a structural diagram of yet another array substrate according to some embodiments.
Figure 7E:
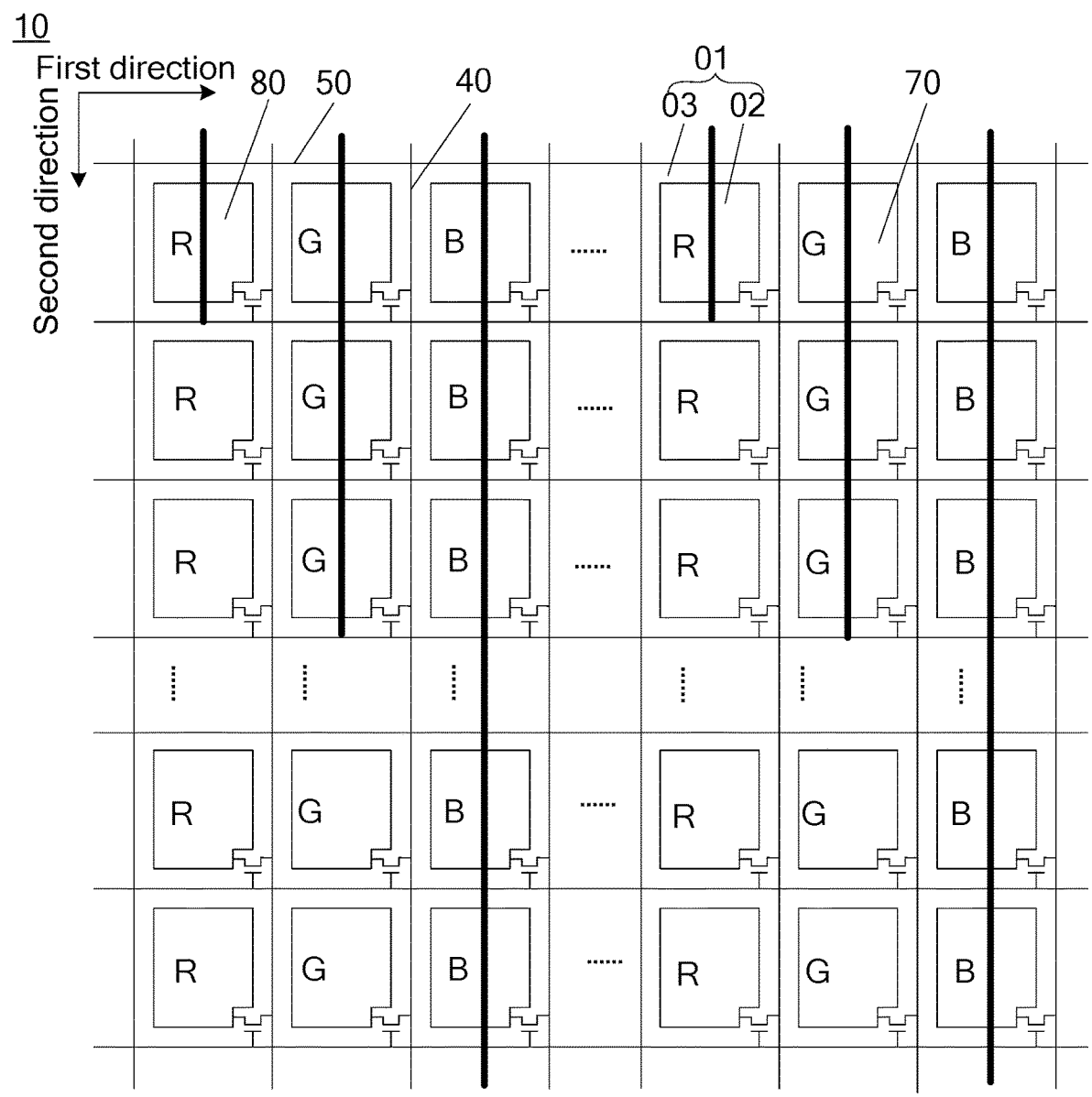
FIG. 7E is a structural diagram of yet another array substrate according to some embodiments.

The array substrate includes the plurality of touch signal lines 70. It may be that one or more opening regions 02 located in a same column correspond to a single touch signal line 70; or, it may be that one or more opening regions 02 located in the same column correspond to two or more touch signal lines 70. In some embodiments, as shown in FIG. 7A, a column of opening regions 02 correspond to a single touch signal line 70. In some embodiments, as shown in FIG. 7D, a column of opening regions 02 correspond to two touch signal lines 70. In some embodiments, as shown in FIG. 7E, an orthographic projection of a single touch signal line 70 on the base passes through, along an extending direction thereof, orthographic projection(s) of one or more opening regions on the base.

In some embodiments of the present disclosure, the touch signal line 70 corresponds to one or more opening regions 02. In this way, since the touch signal line 70 will not have a shielding effect on the data lines 40, it may be possible to prevent the touch signal line 70 from affecting the capacitance between the data lines 40 and the pixel electrode 80. In this way, when the data lines 40 are scanned column by column, the capacitance between the pixel electrode 80 and the data line 40 on its left side is substantially equal to the capacitance between the pixel electrode 80 and the data line 40 on its right side. That is, Cpd is approximately equal to Cpd' (Cpd≈Cpd'). Therefore, the capacitance changes caused by the signal changes on the data lines 40 on the left and right sides of each sub-pixel 01 are substantially equal. That is, ΔC is approximately equal to zero (ΔC≈0). From the foregoing formula, it can be seen that the change amount ΔVp of the voltage applied to the pixel electrode 80 is approximately equal to zero (ΔVp≈0). In this way, the voltage applied to the pixel electrode 80 of each sub-pixel 01 will not decrease, and the brightness of each sub-pixel 01 will not decrease. As a result, the display quality of the display screen may be ensured, and a problem of color cast caused by the change in the brightness ratio of various colors of the display screen may be avoided.

On this basis, in some embodiments of the present disclosure, since the at least one touch signal line 70 is correspondingly disposed in the opening region(s) 02, an area of the pixel defining region 03 may be reduced, an aperture ratio of the pixel may be increased, and a distribution of the opening regions 02 may be more uniform.

In a case where the orthographic projection of the at least one touch signal line 70 on the base passes through, along the extending direction thereof, the orthographic projection(s) of corresponding one or more opening regions 02 on the base, a position of the touch signal line 70 corresponding to the opening region(s) 02 is not limited. For a single touch signal line 70, in some embodiments, distances between the touch signal line 70 and two data lines 40 adjacent thereto are equal; in some other embodiments, distances between the touch signal line 70 and two data lines 40 adjacent thereto are different. In some embodiments, distances between each touch signal line 70 and two data lines 40 adjacent thereto are equal. Therefore, each touch signal line 70 has the same effect on a capacitance generated between the pixel electrode 80 and the data line 40 on its left and a capacitance generated between the pixel electrode 80 and the data line 40 on its right side.

In some embodiments, a number of touch signal lines 70 provided in the array substrate 10 is not limited. In some embodiments, as shown in FIG. 7C, the number of touch signal lines 70 is the same as a number of sub-pixels 01 arranged in the first direction. That is, a single touch signal line 70 is provided for each column of sub-pixels 01. In some other embodiments, the number of touch signal lines 70 is designed according to a number of columns of pixels 101 corresponding to a single touch electrode 60 and a number of rows of touch electrodes 60 included in the array substrate 10.

Figure 6A:
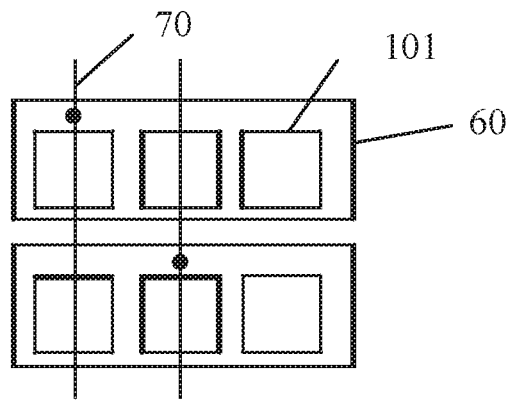
FIG. 6A is a structural diagram of an arrangement manner of touch signal lines according to some embodiments.
Figure 6B:
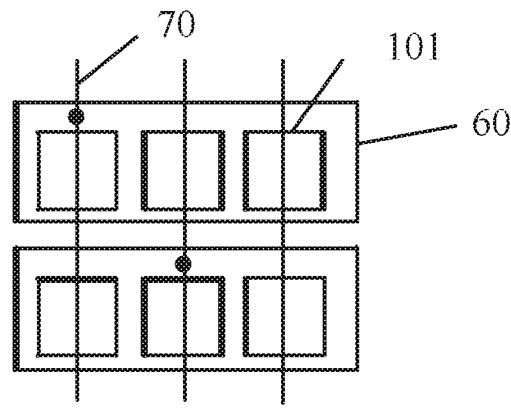
FIG. 6B is a structural diagram of another arrangement manner of touch signal lines according to some embodiments.

In some embodiments, in a case where the number of columns of pixels 101 corresponding to a single touch electrode 60 is greater than the number of rows of touch electrodes 60 in the array substrate 10, each of at least a part of a plurality of pixels 101 corresponding to the touch electrode 60 corresponds to a single touch signal line 70. For example, FIG. 6A shows three columns of pixels 101 and two rows of touch electrodes 60, among which a single touch electrode 60 corresponds to the three columns of pixels 101; two of the three columns of pixels 101 respectively correspond to two touch signal lines 70, and the two touch signal lines 70 are respectively connected to two touch electrodes 60. Or, as shown in FIG. 6B, the three columns of pixels 101 respectively correspond to three touch signal lines 70. A touch signal line 70 on the right in FIG. 6B is a dummy signal line.

Figure 6C:
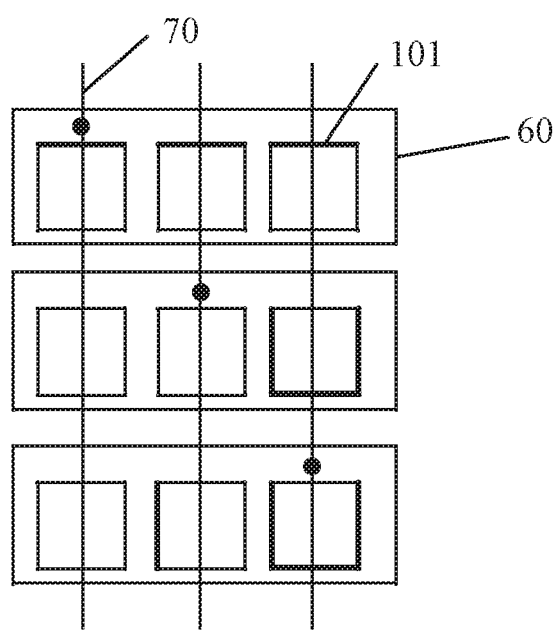
FIG. 6C is a structural diagram of yet another arrangement manner of touch signal lines according to some embodiments.

In some embodiments, in a case where the number of columns of pixels 101 corresponding to a single touch electrode 60 is equal to the number of rows of touch electrodes 60 in the array substrate 10, each of a plurality of pixels 101 corresponding to the touch electrode 60 corresponds to a single touch signal line 70. For example, FIG. 6C shows three columns of pixels 101 and three rows of touch electrodes 60, among which a single touch electrode 60 corresponds to the three columns of pixels 101; the three columns of pixels 101 respectively correspond to three touch signal lines 70, and the three touch signal lines 70 are respectively connected to three touch electrodes 60.

Figure 6D:
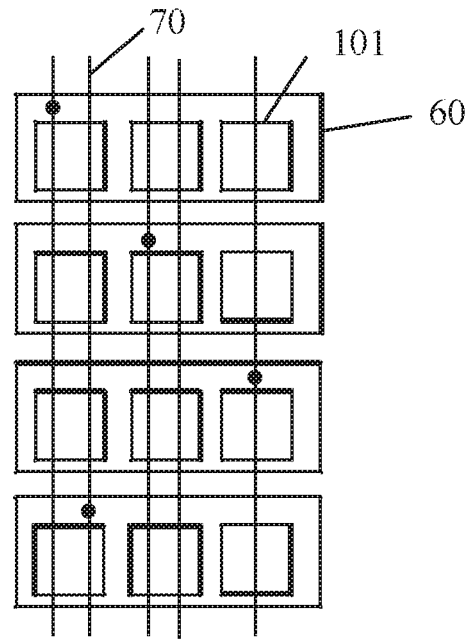
FIG. 6D is a structural diagram of yet another arrangement manner of touch signal lines according to some embodiments.

In some embodiments, in a case where the number of columns of pixels 101 corresponding to a single touch electrode 60 is less than the number of rows of touch electrodes 60 in the array substrate 10, each of at least a part of a plurality of pixels 101 corresponding to the touch electrode 60 corresponds to at least two touch signal lines 70. For example, FIG. 6D shows three columns of pixels 101 and four rows of touch electrodes 60, among which a single touch electrode 60 corresponds to the three columns of pixels 101. A column of pixels 101 on the left in FIG. 6D corresponds to two touch signal lines 70, and the two touch signal lines 70 are respectively connected to two touch electrodes 60. A column of pixels 101 in the middle in FIG. 6D corresponds to two touch signal lines 70, and one of the two touch signal lines 70 is connected to a single touch electrode 60, and the other is a dummy signal line. A column of pixels 101 on the right in FIG. 6D corresponds to a single touch signal line 70, and the touch signal line 70 is connected to a single touch electrode 60.

It will be noted that, the touch signal line 70 set as a dummy signal line may be connected to a control unit, and the control unit provides a certain voltage for it; or may be connected to a voltage input terminal, and a certain voltage is input to it from the voltage input terminal. In some embodiments, each column of sub-pixels 01 corresponds to a single touch signal line 70, in this case, some of the plurality of touch signal lines 70 may be set as dummy signal lines, and a voltage applied to the dummy signal lines may be the same as a voltage applied to other touch signal lines 70. In this way, it may be possible to ensure that the effect of each touch signal line on each sub-pixel is uniform as possible. That is, a voltage deviation of each sub-pixel 01 is the same, and the brightness ratio of the sub-pixels in each pixel remains unchanged, so that the problem of color cast may be avoided. Moreover, it may be possible to prevent different voltages on the touch signal lines from affecting electric fields at different positions in the display apparatus, and thereby improve a display uniformity of the display screen.

Those skilled in the art will understand that FIGS. 6A to 6D only schematically illustrates some arrangement manners of the touch signal lines 70, which are not limited in the embodiments of the present disclosure. FIGS. 6A to 6D only schematically illustrates the number of columns of pixels 101 and the number of rows of touch electrodes 60, and do not constitute any limitation to the number of columns of pixels and the number of rows of touch electrodes in the array substrate in the embodiments of the present disclosure. FIGS. 6A to 6D only schematically illustrates a shape of the touch electrode 60, which is not limited by the embodiments of the present disclosure.

In some embodiments, as shown in FIG. 7C, the number of touch signal lines 70 is the same as the number of sub-pixels 01 arranged in the first direction. In this way, each column of sub-pixels 01 corresponds to a single touch signal line 70, and the touch signal line 70 has the same effect on the electric field of each sub-pixel 01. That is, the voltage deviation of each sub-pixel 01 is the same, the brightness ratio of each sub-pixel 01 remains unchanged, and the problem of color cast is avoided.

In some embodiments, as shown in FIGS. 8B, 9B, 10B, and 11B, the array substrate 10 further includes a common electrode 90 and a plurality of pixel electrodes 80 that are disposed above the base 130. In some embodiments, the common electrode 90 includes a plurality of sub-common electrodes 901 that are insulated from each other, and each sub-common electrode 901 is connected to at least one touch signal line 70.

Herein, the sub-common electrode 901 serves as a touch electrode 60. That is, the sub-common electrode 901 is equivalent to a touch electrode 60.

Materials of the common electrode 90 and the pixel electrodes 80 are both transparent conductive materials, such as ITO or IZO.

It will be noted that, in a case where the array substrate 10 is an array substrate in a self-luminous device, the pixel electrodes 80 may also be referred to as anodes, and the common electrode 90 may also be referred to as a cathode.

Figure 12A:
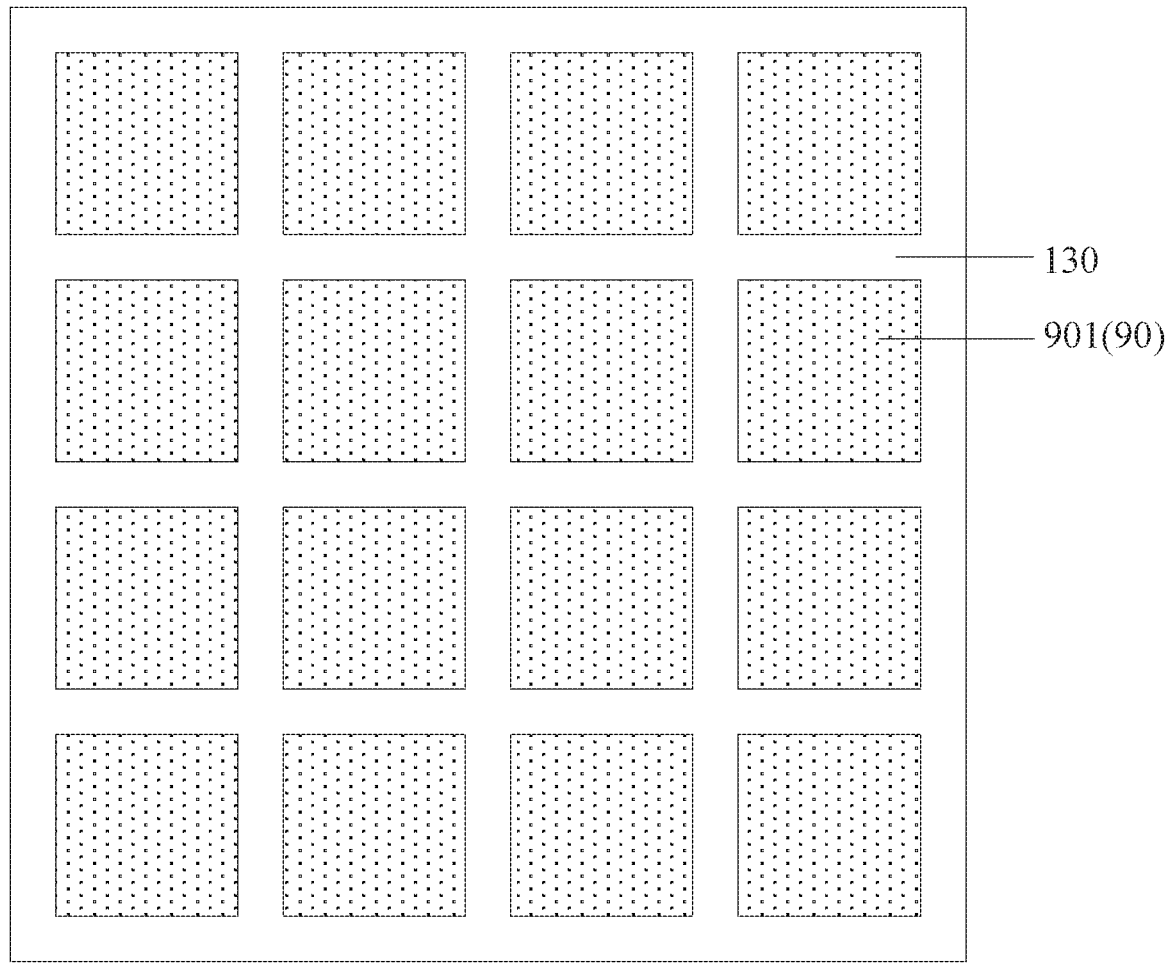
FIG. 12A is a structural diagram of a common electrode in an array substrate according to some embodiments.
Figure 12B:
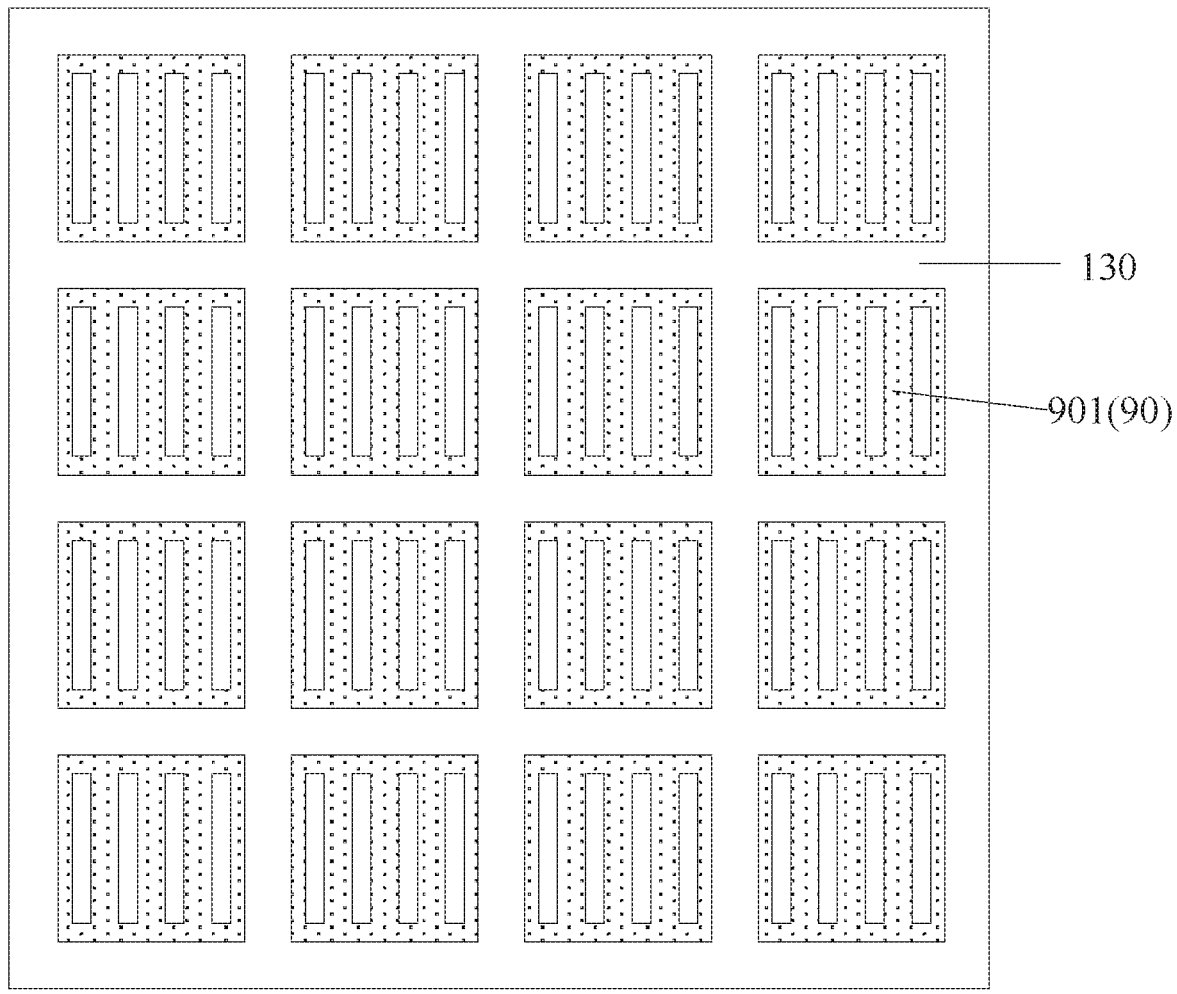
FIG. 12B is a structural diagram of a common electrode in another array substrate according to some embodiments.

The common electrode 90 includes the plurality of sub-common electrodes 901. A structure of the sub-common electrode 901 is not limited in the embodiments of the present disclosure. In some embodiments, as shown in FIG. 12A, the sub-common electrode 901 is block-shaped. That is, the sub-common electrode 901 has no through hole. In some other embodiments, as shown in FIG. 12B, the sub-common electrode 901 includes second through holes 22. The embodiments of the present disclosure do not limit a number of second through holes 22 included in the sub-common electrode 901, which may be set according to a size of the sub-common electrode 901. In addition, the embodiments of the present disclosure do not limit a shape of the second through holes 22, and the shape of the second through holes 22 may be, for example, a rectangle, a square, a rhombus, a strip, or the like. In some embodiments, as shown in FIG. 12B, the shape of the second through holes 22 is a strip extending in the second direction. In a case where the sub-common electrode 901 includes second through hole(s) 22, since an area of the sub-common electrode 901 is reduced, power consumption of a corresponding sub-pixel may be reduced. In a case where the sub-common electrode 901 has no through hole, an electric field between the sub-common electrode 901 and the pixel electrode 80 is strong, and a light transmittance of the corresponding sub-pixel may be increased.

A structure of the pixel electrode 80 is not limited in the embodiments of the present disclosure. In some embodiments, as shown in FIGS. 8A, 8B, 9A, and 9B, the pixel electrode 80 is an entire block. That is, the pixel electrode 80 has no through hole. In some other embodiments, as shown in FIGS. 10A, 10B, 11A, and 11B, the pixel electrode 80 includes a first through hole 21. The embodiments of the present disclosure do not limit a number of first through holes 21 included in the pixel electrode 80, which may be set according to actual needs. In a case where the pixel electrode 80 includes the first through hole 21, since an area of the pixel electrode 80 is reduced, the power consumption of the corresponding sub-pixel may be reduced. In a case where the pixel electrode 80 has no through hole, the electric field between the common electrode 90 and the pixel electrode 80 is strong, and the light transmittance of the corresponding sub-pixel may be increased. In some embodiments, the touch signal line 70 includes a first portion and a second portion that are connected to each other. As shown in FIGS. 8A, 8B, 9A, and 9B, an orthographic projection of the first portion on the base 130 is located within orthographic projection(s) of corresponding one or more pixel electrodes 80 on the base 130.

It will be noted that, in a case where the orthographic projection of the first portion of the touch signal line 70 on the base 130 is located within the orthographic projection(s) of the pixel electrode(s) 80 on the base 130, one pixel electrode 80 may include at least one first through hole 21, or may have no through hole.

In a case where the orthographic projection of the first portion of the touch signal line 70 on the base 130 is located within the orthographic projection(s) of corresponding one or more pixel electrodes 80 on the base 130, the sub-common electrode 901 may include at least one second through hole 22, or may have no through hole.

Figure 8A:
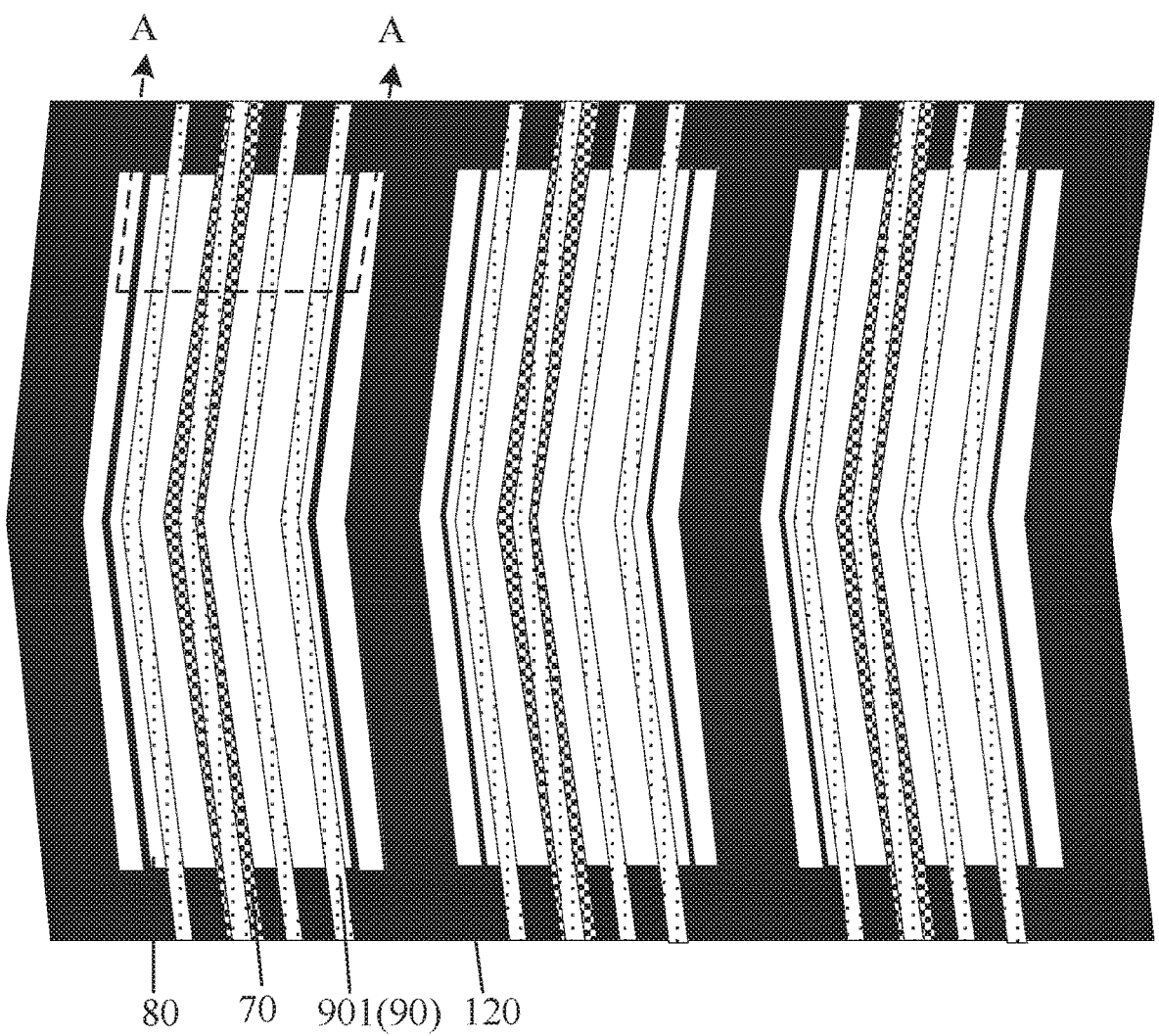
FIG. 8A is a structural diagram of a portion of yet another array substrate according to some embodiments.
Figure 8B:
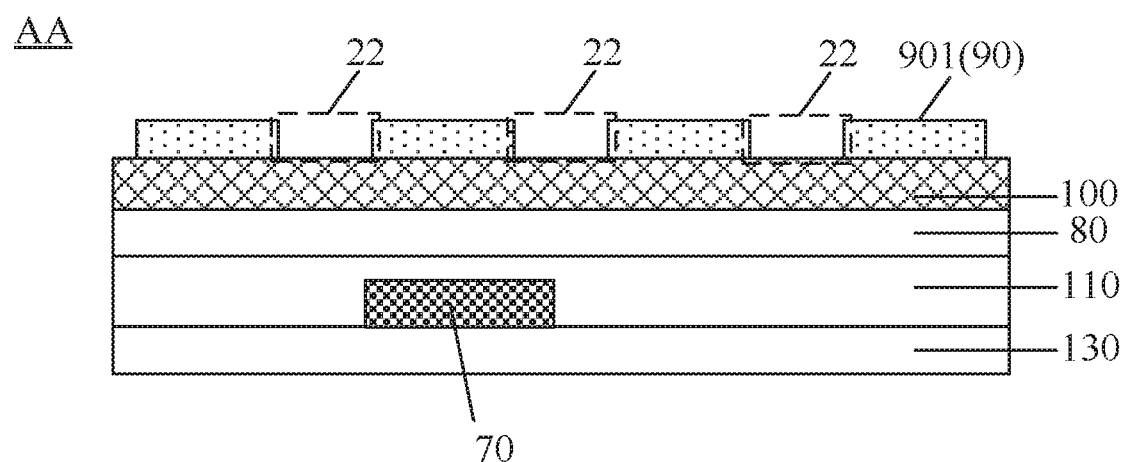
FIG. 8B is a schematic sectional diagram taken along AA direction in FIG. 8A.
Figure 9A:
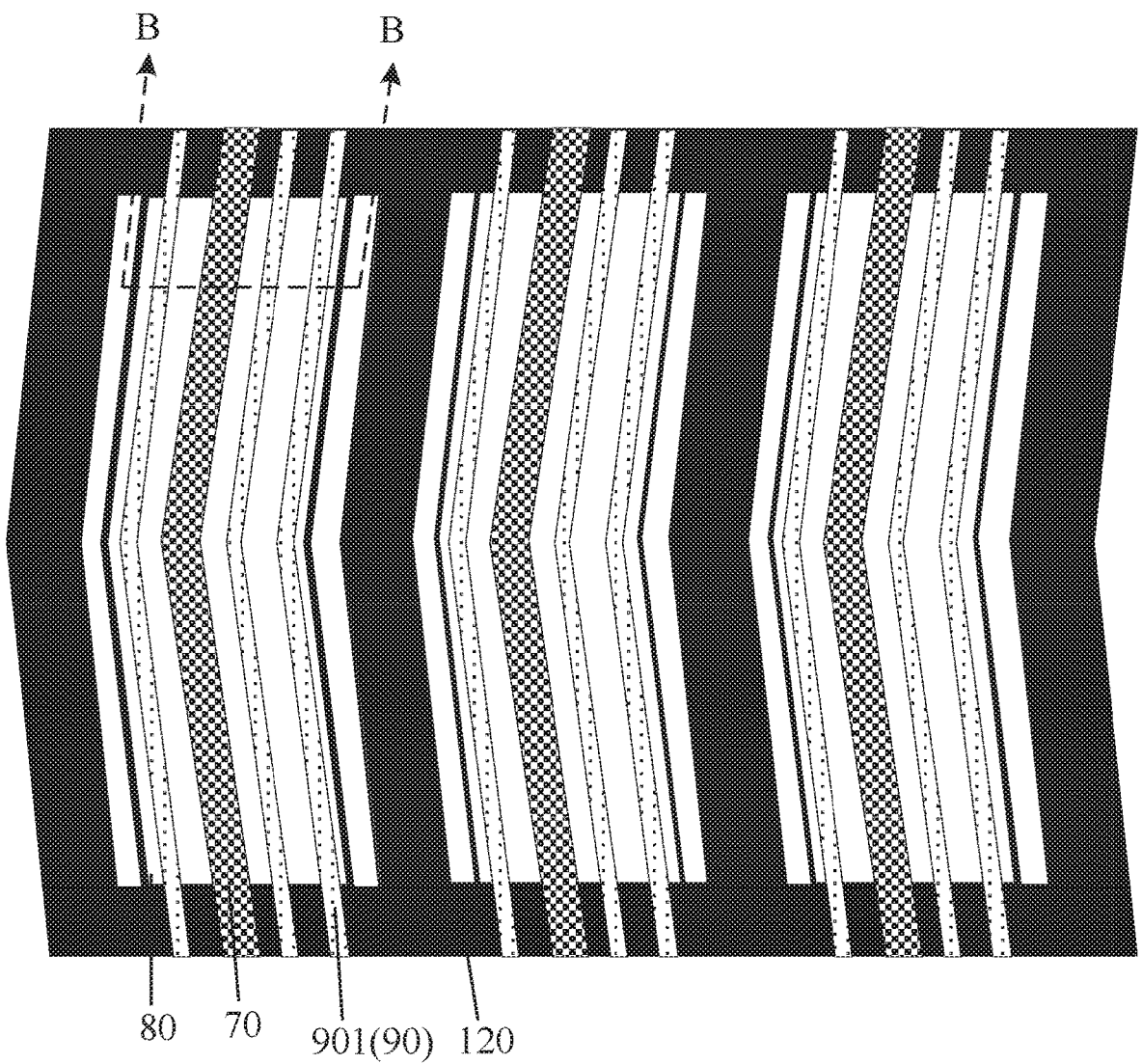
FIG. 9A is a structural diagram of a portion of yet another array substrate according to some embodiments.
Figure 9B:
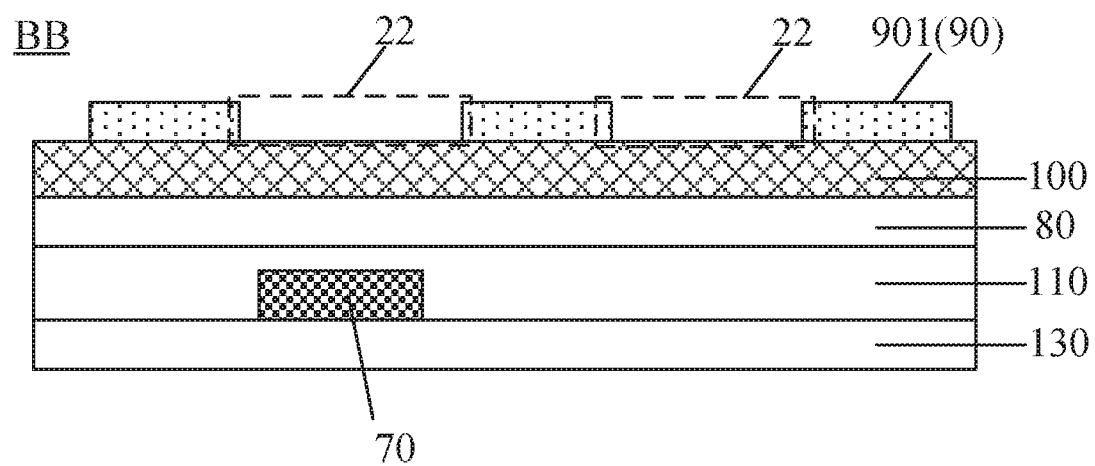
FIG. 9B is a schematic sectional diagram taken along BB direction in FIG. 9A.

In a case where the pixel electrode 80 has no through hole and the sub-common electrode 901 includes at least one second through hole 22, in some embodiments, as shown in FIGS. 8A and 8B, the orthographic projection of the first portion of the touch signal line 70 on the base 130 at least partially overlaps with the orthographic projection of the sub-common electrode 901 on the base 130. In some other embodiments, as shown in FIGS. 9A and 9B, the orthographic projection of the first portion of the touch signal line 70 on the base 130 is located within the orthographic projection of a second through hole 22 on the base 130.

Since the orthographic projection of the first portion of the touch signal line 70 on the base 130 is located within the orthographic projection(s) of the pixel electrode(s) 80 on the base 130, the pixel electrode(s) 80 may be able to shield the electric field generated by the touch signal line 70, thereby reducing the effect of the touch signal line 70 on the electric field(s) of the pixel electrode(s) 80 and the common electrode 90 and improving the light transmittance of the entire pixel(s). In a case where the orthographic projection of the first portion of the touch signal line 70 on the base 130 is located within the orthographic projection of the second through hole 22 on the base 130, the area of the sub-common electrode 901 is correspondingly reduced, and the power consumption of the corresponding sub-pixel may be reduced.

In a case where the pixel electrode 80 includes at least one first through hole 21, in some embodiments, as shown in FIGS. 10A, 10B, 11A, and 11B, the orthographic projection of the first portion of the touch signal line 70 on the base 130 is located within an orthographic projection of a first through hole 21 on the base 130.

Figure 10A:
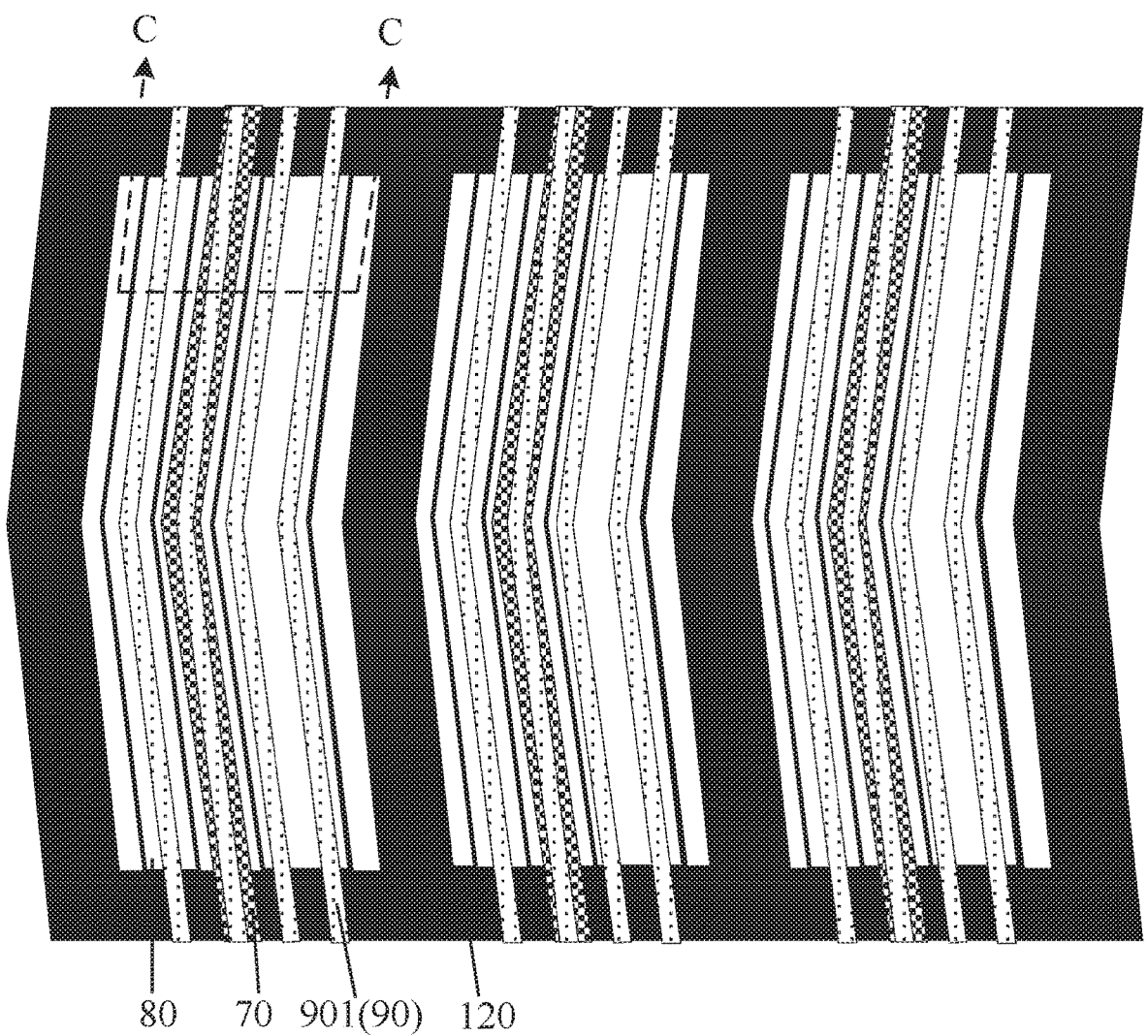
FIG. 10A is a structural diagram of a portion of yet another array substrate according to some embodiments.
Figure 10B:
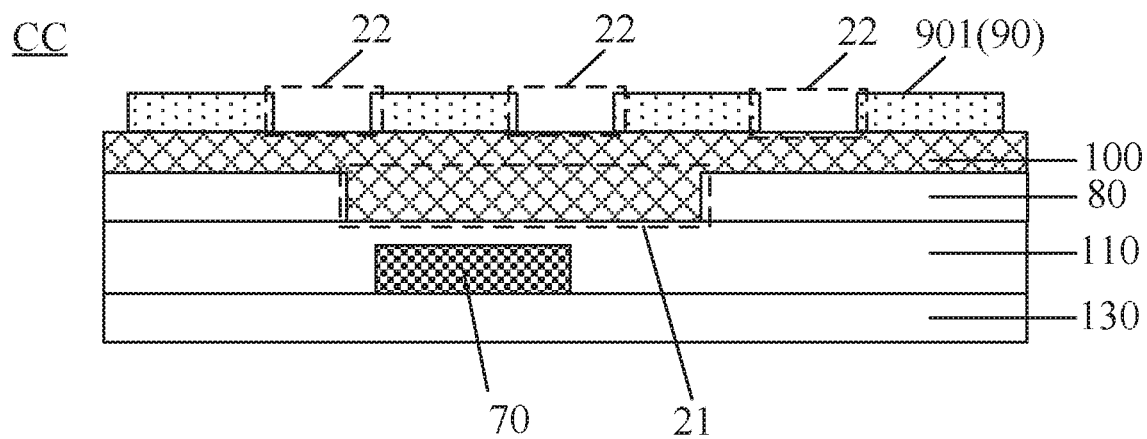
FIG. 10B is a schematic sectional diagram taken along CC direction in FIG. 10A.
Figure 11A:
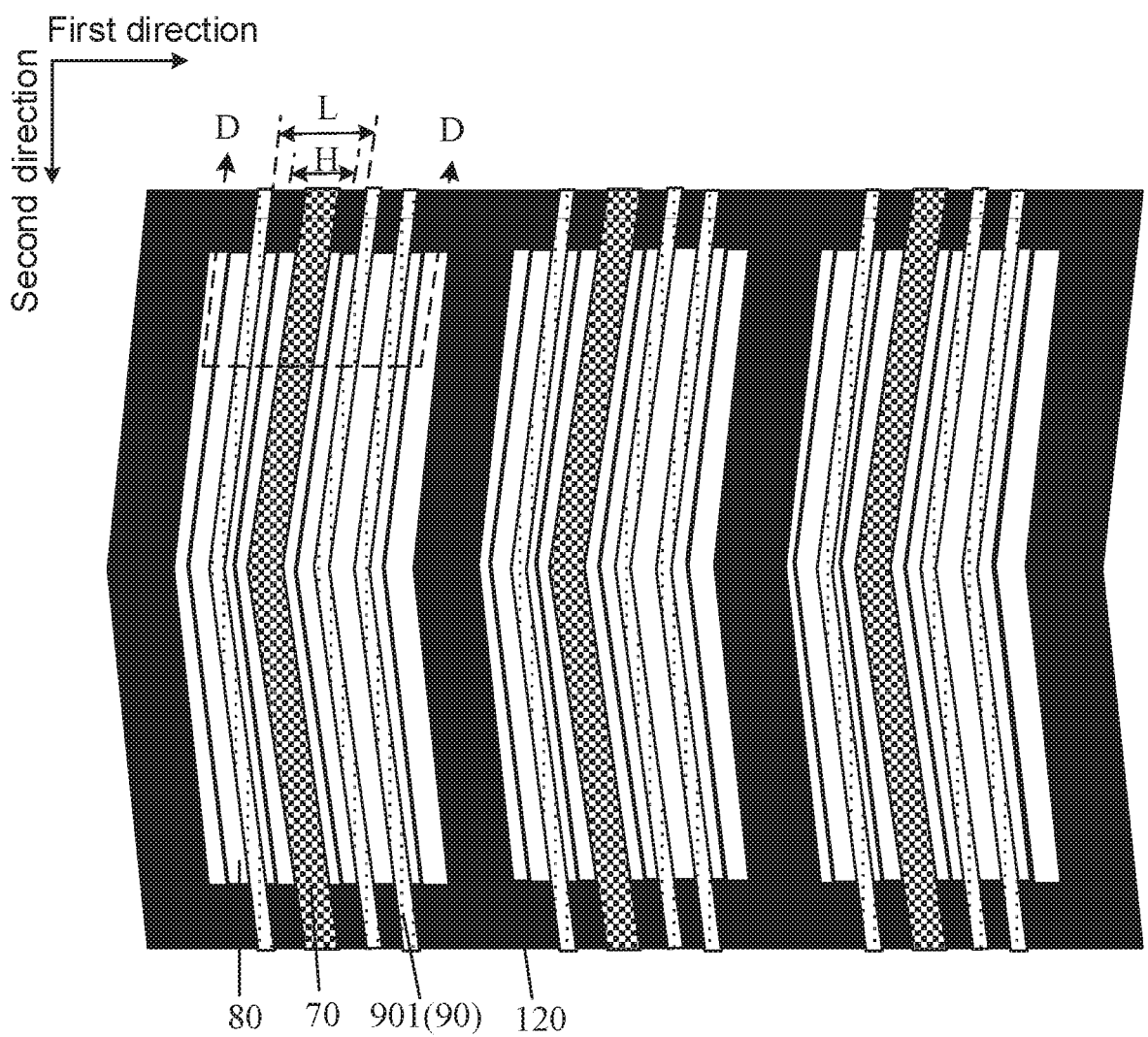
FIG. 11A is a structural diagram of a portion of yet another array substrate according to some embodiments.
Figure 11B:
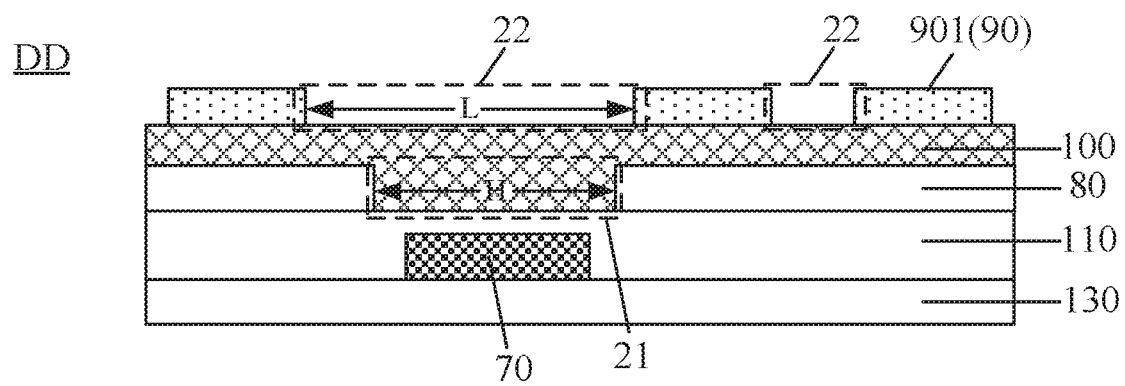
FIG. 11B is a schematic sectional diagram taken along DD direction in FIG. 11A.

In the case where the pixel electrode 80 includes the at least one first through hole 21, in some embodiments, as shown in FIGS. 10A, 10B, 11A, and 11B, the sub-common electrode 901 includes second through holes 22; in some other embodiments, the sub-common electrode 901 does not include through hole. In the case where the pixel electrode 80 includes the at least one first through hole 21, and the sub-common electrode 901 includes the at least one second through hole 22, it may be that there is no overlapping region between the orthographic projection of the first portion of the touch signal line 70 on the base 130 and the orthographic projection of the pixel electrode 80 on the base 130, and there is an overlapping region between the orthographic projection of the first portion of the touch signal line 70 on the base 130 and the orthographic projection of the sub-common electrode 901 on the base 130, as shown in FIGS. 10A and 10B. It may also be that the orthographic projection of the first portion of the touch signal line 70 on the base 130 is located within the orthographic projection of the first through hole 21 on the base 130, and is located within the orthographic projection of the second through hole 22 on the base 130, as shown in FIGS. 11A and 11B.

In the case where the pixel electrode 80 includes the at least one first through hole 21, electric field(s) between the first through hole(s) 21 in the pixel electrode 80 and the common electrode 90 are weak. During a design process of the touch signal line 70, it may be arranged that the orthographic projection of the first portion of the touch signal line 70 on the base 130 is located within an orthographic projection of a first through hole 21 on the base 130. That is, the touch signal line 70 is arranged at a position directly opposite to the first through hole 21 in the pixel electrode 80. In this way, the touch signal line 70 may have a small effect on the electric field of the pixel electrode 80 and the common electrode 90, and the light transmittance of the corresponding sub-pixel when a voltage is applied thereon may be improved.

In a case where the sub-common electrode 901 includes the second through holes 22, in some embodiments, as shown in FIGS. 9A, 9B, 11A, and 11B, the orthographic projection of the first portion of the touch signal line 70 on the base 130 is located within an orthographic projection of a second through hole 22 on the base 130.

Herein, the structure of the pixel electrode 80 is not limited in the embodiments of the present disclosure. The pixel electrode 80 may include the first through hole(s) 21, or may have no through hole. In the case where the pixel electrode 80 includes the first through hole(s) 21, the number and shape of the first through holes 21 are not limited by the embodiments of the present disclosure, and may be set according to actual needs.

In some embodiments, the orthographic projection of the first portion of the touch signal line 70 on the base 130 is located within the orthographic projection of the second through hole 22 of the sub-common electrode 901 on the base 130. That is, the touch signal line 70 is arranged at a position directly opposite to the second through hole 22 in the sub-common electrode 901. Since the electric field between the second through hole 22 in the sub-common electrode 901 and the pixel electrode 80 is weak, by arranging the touch signal line 70 at the position directly opposite to the second through hole 22 in the sub-common electrode 901, the touch signal line 70 may have a small effect on the electric field generated by the pixel electrode 80 and the common electrode 90, and the light transmittance of the corresponding sub-pixel when a voltage is applied thereon may be improved. In a case where the pixel electrode 80 includes the first through hole(s) 21, and the sub-common electrode 901 includes the second through hole(s) 22, in some embodiments, as shown in FIGS. 11A and 11B, a first through hole 21 and second through holes 22 are both strip-shaped and extend in the second direction.

Widths of the strip-shaped first through hole 21 and second through hole 22 in the first direction are not limited. In some embodiments, a width H of the first through hole 21 in the first direction is equal to a width L of the second through hole 22 in the first direction. In some other embodiments, the width H of the first through hole 21 in the first direction is less than the width L of the second through hole 22 in the first direction. In some other embodiments, the width of the first through hole 21 in the first direction is greater than the width L of the second through hole 22 in the first direction.

In some embodiments, each touch signal line 70 is connected to a single sub-common electrode 901. The touch signal line 70 may be connected to the sub-common electrode 901 through a via hole, which is not limited in the embodiments of the present disclosure. In some other embodiments, two or more touch signal lines 70 are connected to a single sub-common electrode 901, and each touch signal line 70 is connected to the sub-common electrode 901 through a via hole.

On this basis, among the plurality of touch signal lines 70, a distance between every two adjacent touch signal lines is equal, or not all equal.

In some embodiments, the sub-common electrode 901 serves as a touch electrode 60. The sub-common electrode 901 may not only be used to realize the touch function, but can also cooperate with the pixel electrode 80 to drive liquid crystals to rotate. Since there is no need to manufacture the touch electrodes 40 separately, on one hand, the manufacturing process of the array substrate may be simplified: on another hand, a thickness of the array substrate may be reduced. In some embodiments, the common electrode 90 and the pixel electrodes 80 are arranged in a same layer. In some other embodiments, as shown in FIGS. 8B, 9B, 10B, and 11B, the common electrode 90 and the pixel electrodes 80 are arranged in different layers. In this case, the array substrate 10 further includes a first insulating layer 100 disposed between the common electrode 90 and the pixel electrodes 80.

In a case where the common electrode 90 and the pixel electrodes 80 are arranged in different layers, positions where the common electrode 90, the pixel electrodes 80 and the touch signal lines 70 are located are not limited. In some embodiments, the pixel electrodes 80 are disposed on a side of the common electrode 90 proximate to the base 130, and the touch signal lines 70 are disposed on a side of the pixel electrodes 80 away from the common electrode 90.

In some embodiments, a second insulating layer 110 is disposed between the touch signal lines 70 and the pixel electrodes 80.

In some embodiments, the touch electrodes 60 may be manufactured above the base separately, and the touch electrodes 60 are only used for realizing the touch function.

FIGS. 8A, 9A, 10A, and 11A illustrate the structure of some opening regions 02 of the array substrate 10. FIG. 8B is a schematic sectional diagram taken along AA direction in FIG. 8A; FIG. 9B is a schematic sectional diagram taken along BB direction in FIG. 9A; FIG. 10B is a schematic sectional diagram taken along CC direction in FIG. 10A; and FIG. 11B is a schematic sectional diagram taken along DD direction in FIG. 11A. As shown in FIGS. 8A, 9A, 10A, and 11A, an orthographic projection of a black matrix pattern 120 on the base is located within the pixel defining regions 03, and the black matrix pattern 120 defines the opening regions of the plurality of sub-pixels.

The embodiments of the present disclosure do not limit a material of insulating layers, which may be an inorganic material such as silicon nitride, silicon oxide, or silicon oxynitride, or may be an organic resin and the like.

Embodiments of the present disclosure provide a touch display panel, which includes the array substrate described above.

Figure 13A:
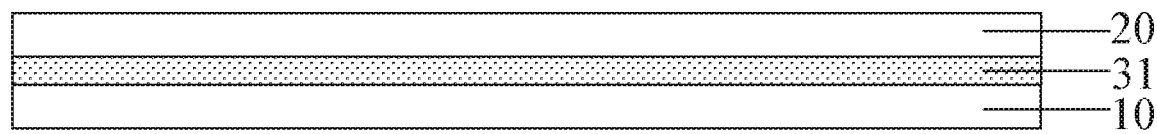
FIG. 13A is a structural diagram of a touch display panel according to some embodiments.
Figure 13B:
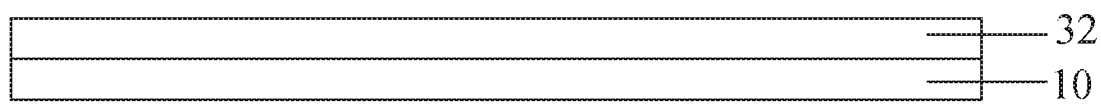
FIG. 13B is a structural diagram of another touch display panel according to some embodiments.

Herein, a type of the touch display panel is not limited. In some embodiments, as shown in FIG. 13A, the touch display panel 100 is an LCD panel. In this case, in addition to the array substrate 10, the touch display panel 100 further includes a color film substrate 20, and a liquid crystal layer 31 disposed between the array substrate 10 and the color film substrate 20. In some other embodiments, as shown in FIG. 13B, the touch display panel 100 is a self-luminous display panel, such as an OLED display panel or a quantum dot light-emitting display (QLED) panel. In a case where the touch display panel 100 is a self-luminous display panel, the array substrate 10 further includes a light-emitting functional layer. Furthermore, the touch display panel further includes an encapsulation layer 32 for encapsulating the array substrate 10.

The embodiments of the present disclosure provide a touch display panel, which includes the array substrate described above. The array substrate in the touch display panel has the same structure and beneficial effects as the array substrate provided in the foregoing embodiments. Since the structure and beneficial effects of the array substrate have been described in detail in the foregoing embodiments, they will not be elaborated herein again.

Figure 14:
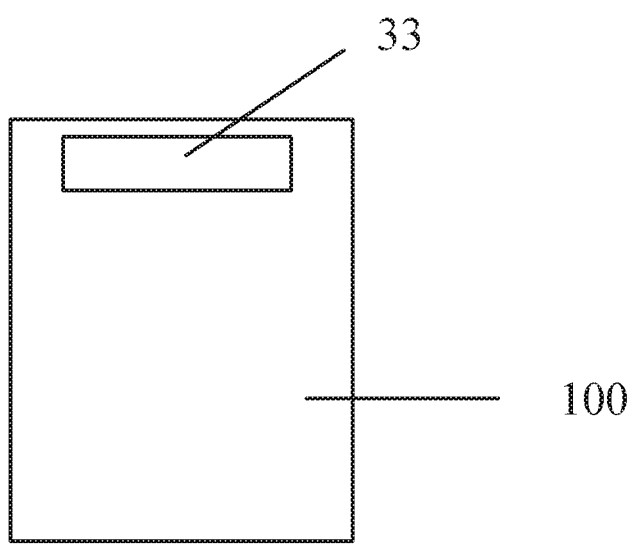
FIG. 14 is a structural diagram of a touch display apparatus according to some embodiments.

Embodiments of the present disclosure provide a touch display apparatus 200. As shown in FIG. 14, the touch display apparatus 200 includes a control unit 33 and the touch display panel 100 described above. The plurality of touch signal lines 70 connected to the plurality of touch electrodes 60 are all connected to the control unit 33. The control unit 33 is used to implement touch control according to signal changes on the plurality of touch signal lines 70 connected to the touch electrodes 60.

Herein, the control unit 33 may be, for example, a driver integrated circuit (IC).

It will be noted that, other touch signal lines 70 that are not connected to the touch electrodes 60 may be set as dummy signal lines, and may be connected to the control unit 33, so that the control unit 33 supplies a certain voltage to the other touch signal lines 70 that are not connected to the touch electrodes 60. Of course, the other touch signal lines 70 that are not connected to the touch electrodes 60 may also be connected to a voltage input terminal, so that the voltage input terminal inputs a certain voltage to the other touch signal lines 70 that are not connected to the touch electrodes 60. The embodiments of the present disclosure do not limit this.

Herein, the touch display apparatus may be any apparatus that displays images whether in motion (e.g., video) or fixed (e.g., still images), and regardless of text or images. More specifically, it is contemplated that the described embodiments may be implemented in or associated with a variety of electronic devices. The variety of electronic devices may include (but are not limit to), for example, mobile telephones, wireless devices, personal data assistant (PDA), hand-held or portable computers, global positioning system (GPS) receivers/navigators, cameras, MPEG-4 Part 14 (MP4) video players, video cameras, game consoles, watches, clocks, calculators, TV monitors, flat panel displays, computer monitors, car displays (odometer display, etc.), navigators, cockpit controllers and/or displays, camera view displays (such as a display of a rear view camera in a vehicle), electronic photos, electronic billboards or signage, projectors, building structures, packaging and aesthetic structures (such as a display for an image of a piece of jewelry), etc.

The embodiments of the present disclosure provide a touch display apparatus, which includes the touch display panel described above. The touch display panel includes an array substrate. The array substrate in the touch display panel has the same structure and beneficial effects as the array substrate provided in the foregoing embodiments. Since the structure and beneficial effects of the array substrate have been described in detail in the foregoing embodiments, they will not be elaborated herein again.

A 10.1 widescreen ultra extended graphics array (WUXGA, with a resolution of 1920×1200) touch display apparatus is taken as an example. The touch signal line 70 is designed to be located in the opening region 02. Touch performance of an actual sample of the 10.1 WUXGA was measured. Test items and results are shown in Table 1.

TABLE 1

| Test category | Test item | Test method | Determination index | Test performance | Determination result |
|---|---|---|---|---|---|
| Sensitivity | Contact a hollow square-shaped line. | Use a copper rod with a diameter of 5 mm to draw a hollow square-shaped line at a speed of 10 mm/s. | Use a copper rod with a diameter of 5 mm to draw lines continuously at a speed of 10 mm/s. | No disconnection using the copper rod with the diameter of 5 mm. | OK |
| Linearity | Draw matrix lines. | Use a copper rod with a diameter of 7 mm to draw 9 × 11 matrix lines at a speed of 10 mm/s, and observe deviations. | Intermediate deviation <1.0 mm Edge deviation <1.5 mm | Intermediate deviation: 0.871 mm Edge deviation: 0.785 mm | OK |
| | Draw slanted lines. | Use a copper rod with a diameter of 7 mm to test a slanted network (e.g., draw more than 5 slanted lines) at a speed of 10 mm/s, and observe deviations. | Intermediate deviation <1.0 mm Edge deviation <1.5 mm | Intermediate deviation: 0.898 mm Edge deviation: 0.572 mm | OK |
| Accuracy | Jitter | Use a copper rod with a diameter of 7 mm to test a 5 × 7 dot matrix. Press each point for 5 seconds, and then lift the copper rod up and record a maximum | Intermediate deviation <1.0 mm Edge deviation <1.5 mm | Intermediate deviation: no jitter Edge deviation: 0.451 mm | OK |

TABLE 1-continued

| Test category | Test item | Test method | Determination index | Test performance | Determination result |
|---|---|---|---|---|---|
| | | difference of the reported point at a same position. | | | |
| | Dot matrix | Use a copper rod with a diameter of 7 mm to test a 5 × 7 dot matrix (a touch pattern of the dot matrix narrowed by 3.5 mm on each side relative to the display region). Click each point for once, test 10 times, and record a maximum deviation. | Intermediate deviation <1.0 mm Edge deviation <1.5 mm | Intermediate deviation: 0.913 mm Edge deviation: 1.1445 mm | OK |

According to the test results in Table 1, it can be seen that the touch display apparatus has a good touch control function and meets actual requirements.

The foregoing descriptions are merely specific implementation manners of the present disclosure, but the protection scope of the present disclosure is not limited thereto. A person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. An array substrate having a plurality of sub-pixel regions, each sub-pixel region including an opening region and a pixel defining region surrounding the opening region, comprising:
   a base;
   a plurality of touch signal lines disposed on the base,
      wherein an orthographic projection of each touch signal line on the base passes through, along an extending direction thereof, each opening region of a column of sub-pixels in which the touch control signal line is located, and
      each touch signal line includes a first portion and a second portion that are connected to each other; and
   a common electrode disposed above the base,
      wherein the common electrode includes a plurality of sub-common electrodes that are insulated from each other, each sub-common electrode is connected to at least one touch signal line, and each sub-common electrode includes at least one second through hole,
      an orthographic projection of the first portion of each touch signal line on the base is located within an orthographic projection of at least one second through hole on the base, and
      the at least one second through hole penetrates each sub-common electrode along a thickness direction of the base.

2. The array substrate according to claim 1, further comprising:
   a plurality of pixel electrodes disposed above the base, wherein each pixel electrode is located in an opening region; and
   the plurality of pixel electrodes are located on a side of the common electrode facing the base, and the plurality of touch signal lines are located on a side of the plurality of pixel electrodes facing away from the common electrode.

3. The array substrate according to claim 2, wherein
   an orthographic projection of the first portion on the base is located within an orthographic projection of at least one pixel electrode on the base; and
   an orthographic projection of the second portion on the base is located within at least one pixel defining region.

4. The array substrate according to claim 3, wherein each pixel electrode includes at least one first through hole; and
   the orthographic projection of the first portion on the base is further located within an orthographic projection of at least one first through hole on the base.

5. The array substrate according to claim 4, wherein
   the orthographic projection of the at least one first through hole on the base is strip-shaped;
   or, the orthographic projection of the at least one second through hole on the base is strip-shaped;
   or, the orthographic projection of the at least one first through hole and the orthographic projection of the at least one second through hole on the base are strip-shaped.

6. The array substrate according to claim 5, wherein in the at least one first through hole, a width of each first through hole in a first direction is less than a width of a second through hole directly opposite thereto in the first direction, the first direction being perpendicular to the extending direction of the at least one touch signal line.

7. The array substrate according to claim 2, wherein
   each pixel electrode includes at least one first through hole;
   an orthographic projection of the second portion on the base is located within at least one pixel defining region; and
   an orthographic projection of the first portion on the base is located within an orthographic projection of at least one first through hole on the base.

8. The array substrate according to claim 1, further comprising:
   a plurality of data lines disposed on the base, wherein
      the extending direction of the at least one touch signal line is parallel with extending directions of the plurality of data lines, and
      in the at least one touch signal line, each touch signal line is located between two adjacent data lines, and distances between each touch signal line and two data lines adjacent thereto are equal.

9. The array substrate according to claim 1, further comprising:
   a plurality of gate lines and a plurality of data lines that are disposed above the base, extending directions of the plurality of gate lines being parallel with a first direction, and extending directions of the plurality of data lines being parallel with a second direction; wherein the first direction and the second direction intersect; the plurality of data lines and the plurality of gate lines define the plurality of sub-pixel regions; and extending directions of the plurality of touch signal lines are parallel with the second direction.

10. The array substrate according to claim 9, wherein the plurality of touch signal lines and the plurality of data lines are arranged in a same layer.

11. The array substrate according to claim 9, wherein a number of the plurality of touch signal lines is same as a number of sub-pixel regions arranged in a same line in the first direction.

12. The array substrate according to claim 1, wherein a width of each touch signal line is within a range from 1.5 μm to 4 μm, inclusive.

13. The array substrate according to claim 1, wherein among the plurality of touch signal lines, a distance between every two adjacent touch signal lines is equal.

14. A touch display panel, comprising the array substrate according to claim 1.

15. A touch display apparatus, comprising:
a controller and the touch display panel according to claim 14, wherein
the plurality of touch signal lines are all electrically connected to the controller, and the controller is configured to implement touch control according to signal changes on the plurality of touch signal lines.

* * * * *